US011462846B2

(12) United States Patent
Seo et al.

(10) Patent No.: US 11,462,846 B2
(45) Date of Patent: Oct. 4, 2022

(54) ELECTRONIC DEVICE INCLUDING CONDUCTIVE STRUCTURE CONNECTING ELECTRICALLY GROUND LAYER OF FLEXIBLE PRINTED CIRCUIT BOARD AND GROUND LAYER OF PRINTED CIRCUIT BOARD

(71) Applicant: SAMSUNG ELECTRONICS CO., LTD., Suwon-si (KR)

(72) Inventors: Seunghan Seo, Suwon-si (KR); Jongpil Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 16/659,970

(22) Filed: Oct. 22, 2019

(65) Prior Publication Data

US 2020/0127404 A1  Apr. 23, 2020

(30) Foreign Application Priority Data

Oct. 23, 2018  (KR) .................. 10-2018-0126469

(51) Int. Cl.
*H01Q 1/38* (2006.01)
*H01R 12/77* (2011.01)
(Continued)

(52) U.S. Cl.
CPC ............ *H01R 12/775* (2013.01); *H01Q 1/38* (2013.01); *H01Q 5/314* (2015.01); *H01Q 21/06* (2013.01); *H01R 12/62* (2013.01); *H01R 12/79* (2013.01)

(58) Field of Classification Search
CPC ...... H01R 12/775; H01R 12/79; H01R 12/62; H01R 4/02; H01Q 21/06; H01Q 5/314;
(Continued)

(56) References Cited

U.S. PATENT DOCUMENTS 7,265,719 B1 * 9/2007 Moosbrugger .... H01Q 21/0025
343/700 MS
8,411,462 B2    4/2013 Jang et al.
(Continued)

FOREIGN PATENT DOCUMENTS

CH      108604722    *  2/2016
KR    10-2008-0023554    3/2008
(Continued)

OTHER PUBLICATIONS

International Search Report and Written Opinion dated Feb. 7, 2020 in counterpart International Patent Application No. PCT/KR2019/013891.

(Continued)

*Primary Examiner* — David E Lotter
(74) *Attorney, Agent, or Firm* — Nixon & Vanderhye P.C.

(57) ABSTRACT

According to various embodiments, an electronic device may include a housing including a first plate, a second plate facing away from the first plate, and a side housing surrounding a space between the first plate and the second plate and joined to the second plate or provided integrally with the second plate, a display viewable through at least part of the first plate, a first Printed Circuit Board (PCB) disposed between the first plate and the second plate and including at least one first ground layer, a Flexible Printed Circuit Board (FPCB) at least partially overlapping the first PCB when viewed from above the first plate and including a first end electrically coupled to the first PCB, a second end, and at least one second ground layer, and a conductive structure comprising a conductive material disposed between the first PCB and the FPCB and electrically coupling the first ground layer and the second ground layer.

19 Claims, 19 Drawing Sheets

(51) Int. Cl.
  *H01Q 21/06* (2006.01)
  *H01R 12/79* (2011.01)
  *H01Q 5/314* (2015.01)
  *H01R 12/62* (2011.01)

(58) Field of Classification Search
  CPC ............ H01Q 1/38; H01Q 5/42; H01Q 1/243; H01Q 21/08; H01Q 21/065
  See application file for complete search history.

(56) References Cited

U.S. PATENT DOCUMENTS

| | | | |
|---|---|---|---|
| 2006/0050490 A1 | 3/2006 | Ootani | |
| 2008/0053713 A1* | 3/2008 | Huang | H05K 1/147 |
| | | | 178/18.03 |
| 2008/0062661 A1 | 3/2008 | Choi et al. | |
| 2010/0240327 A1 | 9/2010 | Lambrecht et al. | |
| 2011/0003622 A1 | 1/2011 | Hwang | |
| 2012/0325524 A1* | 12/2012 | Naganuma | H05K 3/4691 |
| | | | 174/254 |
| 2014/0266973 A1* | 9/2014 | DeVries | H01P 11/001 |
| | | | 343/893 |
| 2016/0261023 A1 | 9/2016 | Di Nallo et al. | |
| 2017/0358847 A1 | 12/2017 | Cho et al. | |
| 2018/0026341 A1* | 1/2018 | Mow | H04B 10/90 |
| | | | 343/702 |
| 2018/0288203 A1 | 10/2018 | Jeon et al. | |
| 2019/0027808 A1* | 1/2019 | Mow | H04R 1/025 |
| 2019/0228404 A1* | 7/2019 | Wang | G06Q 20/204 |
| 2019/0229404 A1* | 7/2019 | Xia | H01Q 21/08 |
| 2019/0260127 A1* | 8/2019 | Shi | H01Q 1/243 |
| 2020/0021015 A1* | 1/2020 | Yun | H01Q 25/00 |
| 2020/0225295 A1* | 7/2020 | Hyun | H02H 3/33 |

FOREIGN PATENT DOCUMENTS

| | | |
|---|---|---|
| KR | 10-1624916 | 5/2016 |
| WO | 2017/146497 | 8/2017 |

OTHER PUBLICATIONS

European Extended Search Report dated Jul. 20, 2021 for EP Application No. 19876629.7.

* cited by examiner

ELECTRONIC DEVICE INCLUDING CONDUCTIVE STRUCTURE CONNECTING ELECTRICALLY GROUND LAYER OF FLEXIBLE PRINTED CIRCUIT BOARD AND GROUND LAYER OF PRINTED CIRCUIT BOARD

CROSS REFERENCE TO RELATED APPLICATION

This application is based on and claims priority under 35 U.S.C. § 119 to Korean Patent Application No. 10-2018-0126469, filed on Oct. 23, 2018, in the Korean Intellectual Property Office, the disclosure of which is incorporated by reference herein in its entirety.

BACKGROUND

Field

The disclosure relates to an electronic device including a ground layer of a Flexible Printed Circuit Board (FPCB) and a conductive structure which electrically couples a ground layer of a Printed Circuit Board (PCB).

Description of Related Art

With the development of digital technologies, electronic devices are provided in various forms, such as a smart phone, a tablet Personal Computer (PC), a Personal Digital Assistant (PDA), or the like. The electronic device is also developed such that it is worn by a user to improve portability and user accessibility. With the development of wireless communication technologies, electronic devices (e.g., communication electronic devices) are widely used in everyday life, and thus the use of content increases exponentially. The electronic device may include a member such as a Flexible Printed Circuit Board (FPCB) which provide electrical coupling between elements regarding a wireless communication circuit.

When electromagnetic noise (e.g., electromagnetic wave noise) generated inside an electronic device has effect on a corresponding transmission line (e.g., an FPCB), performance deterioration may occur. For example, wireless communication of a high frequency band may be more sensitive to an influence of the electromagnetic noise of a high frequency band.

SUMMARY

Embodiments of the disclosure may provide an electronic device including a ground layer of an FPCB and a conductive structure which electrically couples a ground layer of a PCB, to reduce Electro Magnetic Interference (EMI) on the FPCB utilized as a transmission line.

According to an example embodiment, an electronic device may include a housing including a first plate, a second plate facing away from the first plate, and a side housing surrounding a space between the first plate and the second plate and joined to the second plate or constructed integrally with the second plate, a display viewable through at least part of the first plate, a first Printed Circuit Board (PCB) disposed between the first plate and the second plate and including at least one first ground layer, a Flexible Printed Circuit Board (FPCB) at least partially overlapping the first PCB when viewed from above the first plate, the FPCB including a first end electrically coupled to the first PCB, a second end, and at least one second ground layer, and a conductive structure comprising a conductive material disposed between the first PCB and the FPCB and electrically coupling the first ground layer and the second ground layer.

According to various embodiments, since a conductive structure disposed between a Flexible Printed Circuit Board (FPCB) and a Printed Circuit Board (PCB) electrically couples a ground layer of the FPCB and a ground layer of the PCB, Electro Magnetic Interference (EMI) on the FPCB is decreased, thereby improving performance thereof. In addition, the conductive structure may be utilized as a support which props the FPCB, thereby providing a robust structure between the FPCB and the PCB.

BRIEF DESCRIPTION OF THE DRAWINGS

The above and/or other aspects, features and advantages of certain embodiments of the present disclosure will be more apparent from the following detailed description, taken in conjunction with the accompanying drawings, in which.

DETAILED DESCRIPTION

Figure 1:
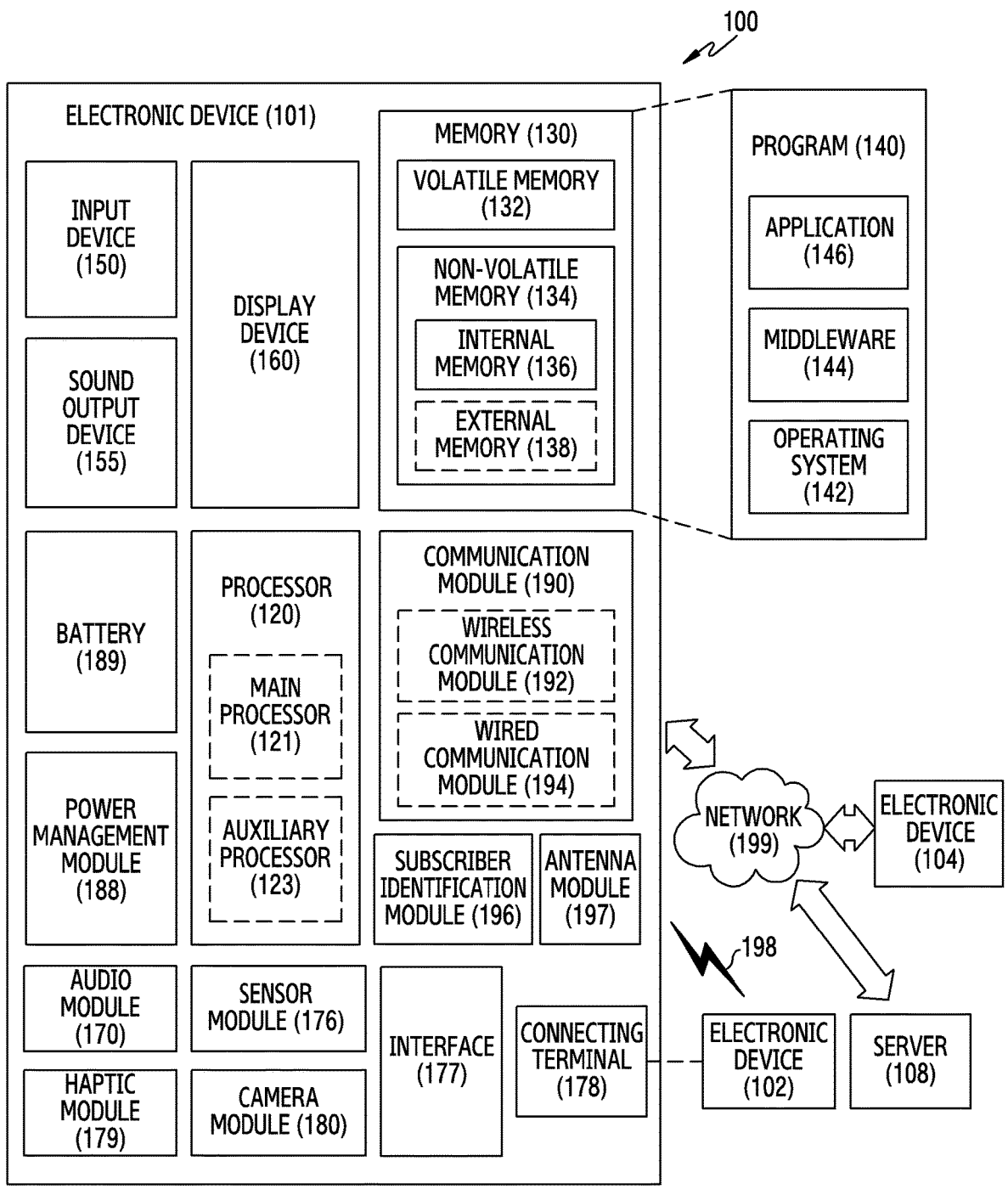
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the displays, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetoot™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, and without limitation, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various example embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
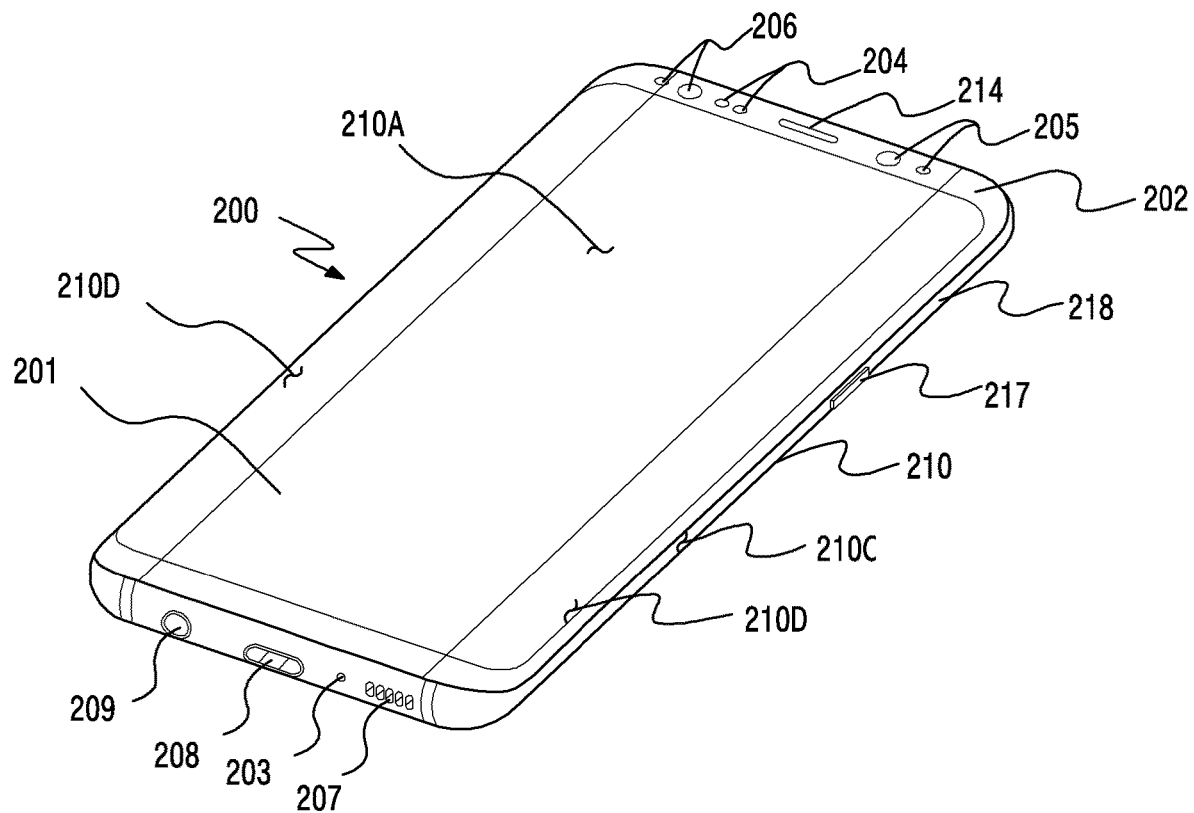
FIG. 2A is a front perspective view illustrating an example mobile electronic device according to an embodiment.
Figure 2B:
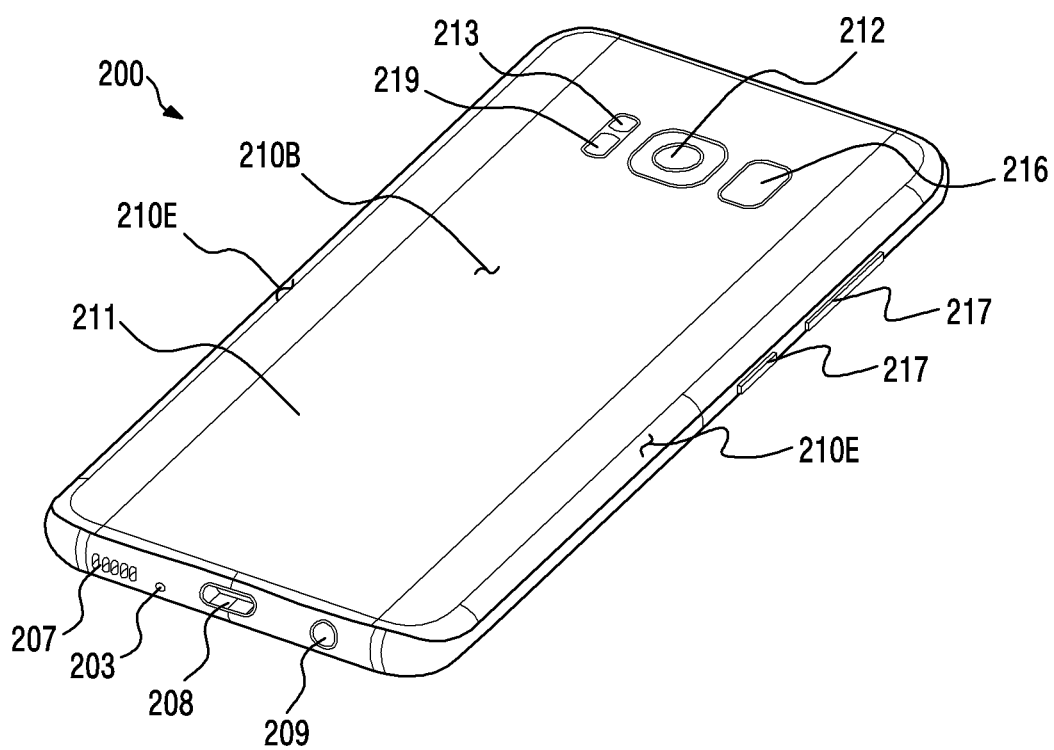
FIG. 2B is a rear perspective view of the example electronic device of FIG. 2A.
Figure 3:
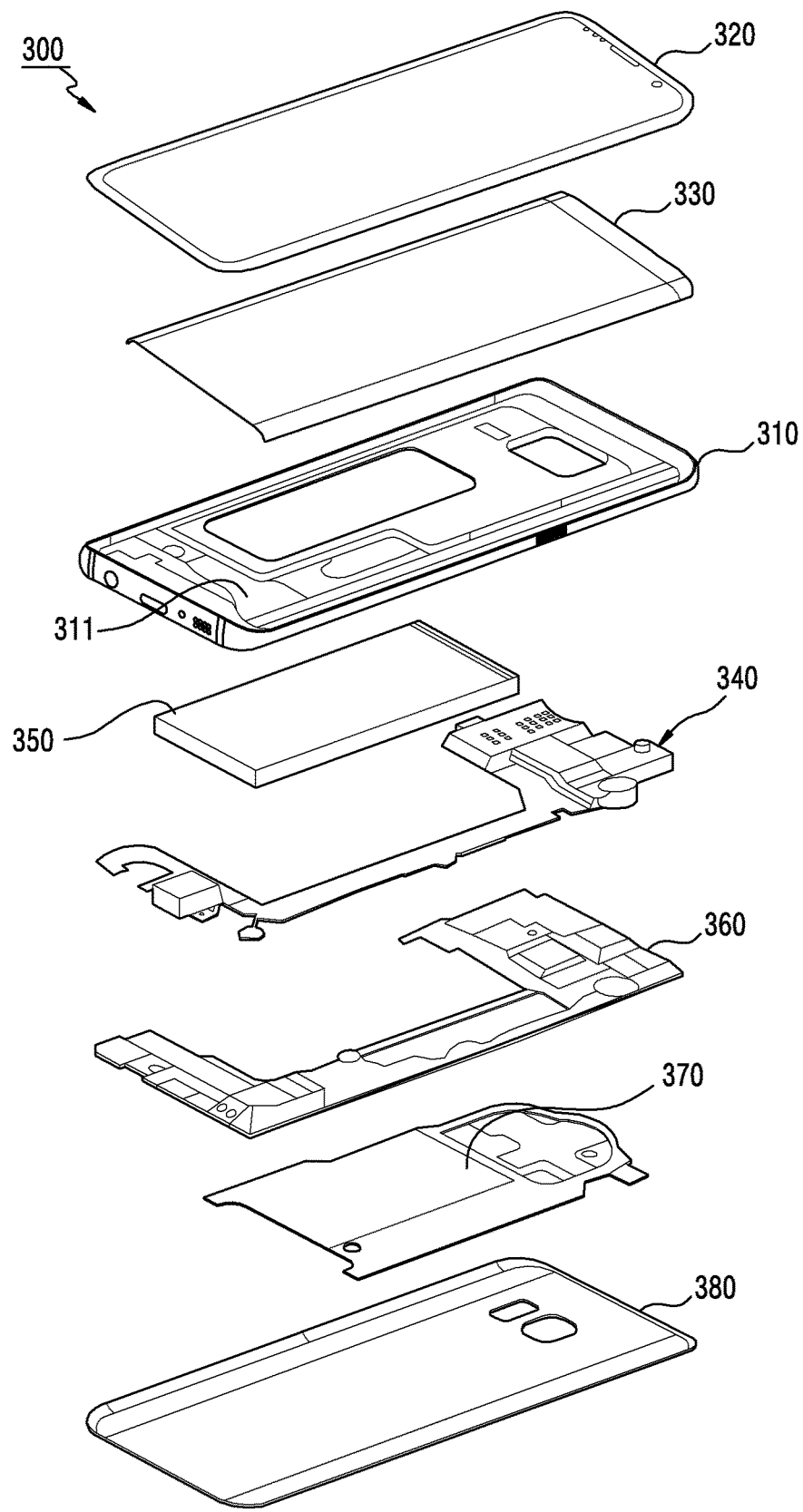
FIG. 3 is an exploded perspective view illustrating an example electronic device according to an embodiment.

FIG. 2A is a front perspective view illustrating an example mobile electronic device according to an embodiment. FIG. 2B is a rear perspective view of the electronic device of FIG. 2A. FIG. 3 is an exploded perspective view of an example electronic device according to an embodiment.

Referring to FIG. 2A and FIG. 2B, an electronic device 200 according to an embodiment may include a housing 210 including a first face (or a front face) 210A, a second face (or a rear face) 210B, and a side face 210C surrounding a space between the first face 210A and the second face 210B. In another embodiment (not shown), the housing may refer to a structure which includes part of the first face 210A, second face 210B, and third face 210C of FIG. 2A. According to an embodiment, the first face 210A may include a front plate 202 (e.g., a polymer plate or a glass plate having various coating layers) which is at least partially transparent. The second face 210B may include a rear plate 211 which is substantially opaque. For example, the rear plate 211 may include coated or colored glass, ceramic, polymer, metallic materials (e.g. aluminum, stainless steel (STS), or magnesium) or a combination of at least two of the these materials. The side face 210C may include a side bezel structure (or a side member) 218 joined with the front plate 202 and the rear plate 211 and including metal and/or polymer. In some embodiments, the rear plate 211 and the side bezel structure 218 may be constructed integrally and may include the same material (e.g., a metallic material such as aluminum).

In the illustrated embodiment, the front plate 202 may include two first regions 210D seamlessly extended by being bent from the first face 210A toward the rear plate 211 at both ends of a long edge of the front plate 202. In the illustrated embodiment (see FIG. 2B), the rear plate 211 may include two second regions 210E seamlessly extended by being bent from the second face 210B toward the front plate 202 at both ends of a long edge. In some embodiments, the front plate 202 (or the rear plate 211) may include only one of the first regions 210D (or the second regions 210E). In another embodiment, part of the first regions 210D or the second regions 210E may not be included. In the above embodiments, in a side view of the electronic device 200, the side bezel structure 218 may have a first thickness (or width) at a side in which the first regions 210D or the second regions 210E is not included, and may have a second thickness thinner than the first thickness at a side in which the first regions 210E or the second regions 210E is included.

According to an embodiment, the electronic device 200 may include at least one or more of a display 201, audio modules 203, 207, and 214, sensor modules 204, 216, and 219, camera modules 205, 212, and 213, a key input device 217, a light emitting element 206, and connector holes 208 and 209. In some embodiments, the electronic device 200 may omit at least one of components (e.g., the key input device 217 or the light emitting element 206), or other components may be additionally included.

The display 201 may be exposed through, for example, some portions of the front plate 202. In some embodiments, at least part of the display 201 may be exposed through the first face 210A and the front plate 202 including the first regions 210E of the side face 210C. In some embodiments, a corner of the display 201 may be include substantially the same as an outer boundary adjacent to the front plate 202. In another embodiment (not shown), in order to expand an area in which the display 201 is exposed, the display 210 and the front plate 202 may have substantially the same interval between outer boundaries thereof.

In another embodiment (not shown), a portion of a screen display region of the display 201 may have a recess or opening, and may include at least one or more of the audio module 214, sensor module 204, camera module 205, and light emitting element 206 which are aligned with the recess or the opening may be included. In another embodiment (not shown), at least one of the audio module 214, the sensor module 204, the camera module 205, the fingerprint sensor 216, and the light emitting element 206 may be included in a rear face of the screen display region of the display 201. In another embodiment (not shown), the display 201 may be disposed adjacent to or joined with a touch sensing circuit, a pressure sensor capable of measuring touch strength (pressure), and/or a digitizer for detecting a magnetic-type stylus pen. In some embodiments, at least part of the sensor modules 204 and 219 and/or at least part of the key input device 217 may be disposed to the first regions 210D and/or the second regions 210E.

The audio modules 203, 207, and 214 may include the microphone hole 203 or the speaker holes 207 and 214. A microphone for acquiring external sound may be disposed inside the microphone hole 203. In some embodiments, a plurality of microphones may be disposed to detect a direction of the sound. The speaker holes 207 and 214 may include the external speaker hole 207 and the receiver hole 214 for a call. In some embodiments, the speaker holes 207 and 214 and the microphone hole 203 may be implemented as one hole, or a speaker (e.g., a Piezo speaker) may be included without the speaker holes 207 and 214.

The sensor modules 204, 216, and 219 may generate an electrical signal or data value corresponding to an internal operational state of the electronic device 200 or an external environmental state. The sensor modules 204, 216, and 219 may include, for example, the first sensor module 204 (e.g., a proximity sensor) and/or second sensor module (not shown) (e.g., a fingerprint sensor) disposed to the first face 210A of the housing 210, and/or the third sensor module 219 (e.g., a Heart Rate Monitoring (HRM) sensor) disposed to the second face 210B of the housing 210 and/or the fourth sensor module 216 (e.g., a fingerprint sensor). The fingerprint sensor may be disposed not only to the first face 210A (e.g., the display 201) but also the second face 210B of the housing 210. The electronic device 200 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

According to an embodiment, the camera modules 205, 212, and 213 may include the first camera module 205 disposed to the first face 210A of the electronic device 200, the second camera module 212 disposed to the second face 210B, and/or the flash 213. The camera module 205 and 212 may include one or more lenses, an image sensor, and/or an image signal processor. The flash 213 may include, for example, a Light Emitting Diode (LED) or a xenon lamp. In some embodiments, two or more lenses (infrared cameras, wide angle and telephoto lenses) and image sensors may be disposed to one face of the electronic device 200.

The key input device 217 may be disposed to the side face 210C of the housing 210. In another embodiment, the electronic device 200 may not include the entirety or part of the key input device 217. The key input device 217, which is not included, may be implemented on a display 201 in a different form such as a soft key or the like. In some embodiments, the key input device may include the sensor module 216 disposed to the second face 210B of the housing 210.

The light emitting element 206 may be disposed, for example, to the first face 210A of the housing 210. The light emitting element 206 may provide, for example, state information of the electronic device 200 in an optical form. In another embodiment, the light emitting element 206 may provide, for example, a light source interworking with an operation of the camera module 205. The light emitting element 206 may include, for example, an LED, an IR LED, and a xenon lamp.

The connector holes 208 and 209 may include the first connector hole 208 capable of accommodating a connector (e.g., a USB connector) for transmitting/receiving power and/or data of an external electronic device and/or the second connector hole (e.g., earphone jack) 209 capable of accommodating a connector for transmitting/receiving an audio signal with respect to the external electronic device.

Referring to FIG. 3, an electronic device 300 (e.g., the electronic device 101 of FIG. 1 or the electronic device 200 of FIG. 2A or FIG. 2B) may include a side bezel structure 310, a first support member 311 (e.g., a bracket), a front plate 320 (e.g., the front plate 202 of FIG. 2A), a display 330 (e.g., the display 201 of FIG. 2A), a Printed Circuit Board (PCB) 340, a battery 350 (e.g., the battery 189 of FIG. 1), a second support member 360 (e.g., a rear case), an antenna 370 (e.g., the antenna module 178 of FIG. 1), and a rear plate 380 (e.g., the rear plate 211 of FIG. 2B). In some embodiments, the electronic device 300 may omit at least one (e.g., the first support member 311 or the second support member 360) of these components, or may additionally include other components. At least one of the components of the electronic device 300 may be the same as or similar to at least one of the components of the electronic device 200 of FIG. 2A or FIG. 2B, and redundant descriptions may not be repeated.

The first support member 311 may be coupled with the side bezel structure 310, for example, by being disposed inside the electronic device 300, or may be integrated with the side bezel structure 310. The first support member 311 may be constructed of, for example, a metal material and/or a non-metal (e.g., polymer) material. The first support member 311 may have the display 330 (e.g., the display 201 of FIG. 2A) joined to one face and the PCB 340 joined to the other face. A processor, a memory, and/or an interface may be mounted on the PCB 340. The processor (e.g., the processor 120 of FIG. 1) may include, for example, one or more of a central processing unit, an application processor, a graphic processing unit, an image signal processor, a sensor hub processor, and/or a communication processor.

The memory (e.g., the memory 130 of FIG. 1) may include, for example, a volatile memory and/or a non-volatile memory.

The interface may include, for example, a High-Definition Multimedia Interface (HDMI), a Universal Serial Bus (USB) interface, an SD card interface, and/or an audio interface. The interface may electrically or physically couple, for example, the electronic device 300 with an external electronic device, and may include a USB connector, an SD card/MMC connector, or an audio connector.

The battery 350 may be a device for supplying power to at least one component of the electronic device 300, and may include, for example, a primary cell which is not rechargeable, a secondary cell which is rechargeable, or a fuel cell. At least part of the battery 350 may be disposed, for example, to be substantially co-planar with the PCB 340. The battery 350 may be disposed inside the electronic device 300, and according to some embodiments, may be disposed to be detachable from the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform short-range communication, for example, with the external electronic device, or may wirelessly transmit/receive power required for charging. In another embodiment, an antenna structure may be constructed by at least part of the side bezel structure 310 and/or the first support member 311 or a combination thereof.

Figure 4:
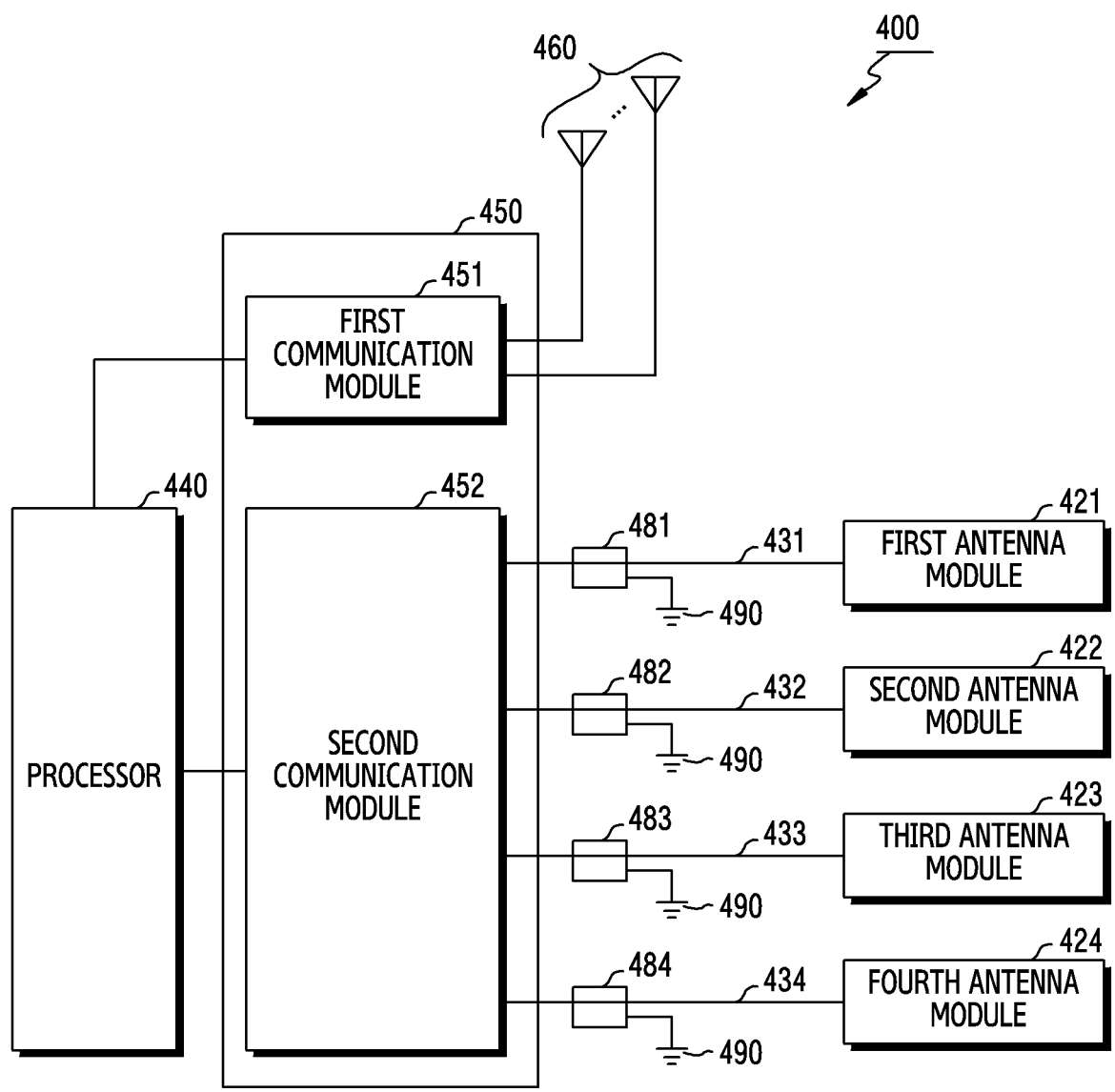
FIG. 4 is a block diagram illustrating an example electronic device including conductive structures for electrically coupling ground layers of Flexible Printed Circuit Boards (FPCBs) and a ground layer of a Printed Circuit Board (PCB) according to an embodiment.

FIG. 4 is a block diagram illustrating an example electronic device including conductive structures for electrically coupling ground layers of FPCBs and a ground layer of a PCB according to an embodiment.

Referring to FIG. 4, an electronic device 400 (e.g., the electronic device 101 of FIG. 1, the electronic device 200 of FIG. 2A or 2B, or the electronic device 300 of FIG. 3) may include at least one of a processor (e.g., including processing circuitry) 440 (e.g., the processor 120 of FIG. 1), a communication module (e.g., including communication circuitry) 450 (e.g., the communication module 190 of FIG. 1), a first antenna module (e.g., including an antenna) 421, a second antenna module (e.g., including an antenna) 422, a third antenna module (e.g., including an antenna) 423, a fourth antenna module (e.g., including an antenna) 424, a first Flexible Printed Circuit Board (FPCB) 431, a second FPCB 432, a third FPCB 433, a fourth FPCB 434, a first conductive structure (e.g., including a conductive material) 481, a second conductive structure (e.g., including a conductive material) 482, a third conductive structure (e.g., including a conductive material) 483, and a fourth conductive structure (e.g., including a conductive material) 484.

According to an embodiment, the processor 440 may include various processing circuitry, such as, for example, and without limitation, one or more of a central processing unit, a Graphic Processing Unit (GPU), an image signal processor of a camera, a baseband processor (or a Communication Processor (CP)), or the like. According to an embodiment, the processor 440 may be implemented as a System on Chip (SoC) or a System in Package (SIP).

According to an embodiment, the communication module 450 may include various communication circuitry and be electrically coupled to the first antenna module 421, the second antenna module 422, the third antenna module 423, and the fourth antenna module 424 through the first FPCB 431, the second FPCB 432, the third FPCB 433, or the fourth FPCB 434. The communication module 450 may include, for example, a baseband processor or at least one communication circuit (e.g., IFIC or RFIC), etc. The communication module 450 may include, for example, a baseband processor separated from the processor 440 (e.g., an Application Processor (AP).

According to some embodiments, some of the first FPCB 431, the second FPCB 432, the third FPCB 433, or the fourth FPCB 434 may be replaced with various other conductive paths such as a coaxial cable.

According to an embodiment, the communication module 450 may include at least one of a first communication module 451 and a second communication module 452 each of which include various communication circuitry. The electronic device 400 may further include one or more interfaces between the communication module 450 and the processor 440 to support communication between chips. The processor 440 and the first communication module 451 and/or the second communication module 452 may transmit or receive data using the interface between the chips (i.e., an inter-processor communication channel).

According to an embodiment, the first communication module 451 and/or the second communication module 452 may provide an interface for performing communication with different entities. The first communication module 451 may support wireless communication, for example, for a first network (not shown) which utilizes one or more antennas 460. The second communication module 452 may support wireless communication, for example, for a second network (not shown) which utilizes the first antenna module 421, the second antenna module 422, the third antenna module 423, and/or the fourth antenna module 424.

According to an embodiment, the first network (not shown) or the second network (not shown) may include the network 199 of FIG. 1. According to an embodiment, the first network may include a $4^{th}$ Generation (4G) network, and the second network may include a $5^{th}$ Generation (5G) network. The 4G network may support, for example, a Long-Term Evolution (LTE) protocol defined in 3GPP. The 5G network may support, for example, a New Radio (NR) protocol defined in 3GPP. According to various embodiments, the first network may relate to Wireless Fidelity (WiFi) or Global Positioning System (GPS).

According to an embodiment, the first communication module 451 may receive a high-frequency signal (hereinafter, a Radio Frequency (RF) signal) for a first network (e.g., a 4G network) through one or more antennas 460, and may transmit the received RF signal to the processor 440 by modulating (e.g., down-converting) it into a low-frequency signal. The first communication module 451 may receive a broadband signal for the first network from the processor 440, and may transmit the received baseband signal to the at least one antenna 460 by modulating (e.g., up-converting) it into an RF signal. According to an embodiment, the first communication module 451 may include a Radio Frequency Integrated Circuit (RFIC). According to various embodiments, when the RF signal is modulated into the baseband signal or when the baseband signal is modulated into the RF signal, an input of a Local Oscillator (LO) may be utilized.

According to an embodiment, the second communication module 452 may receive a baseband signal for the second network from the processor 440. The second communication module 452 may up-covert the baseband signal into an IF signal utilizing an input of the LO (hereinafter, an LO signal), and may transmit the IF signal to the antenna modules 421, 422, 423, and 424 through the FPCBs 431, 432, 433, and 434. The antenna modules 421, 422, 423, and 424 may receive the IF signal from the communication module 450 through the FPCBs 431, 432, 433, and 434. The antenna modules 421, 422, 423, and 424 may up-convert the IF signal into the RF signal utilizing the LO signal, and may transmit the RF signal to the outside through a plurality of antennas (not shown) included in the antenna modules 421, 422, 423, and 424.

According to an embodiment, the antenna modules 421, 422, 423, and 424 may include a plurality of antennas (not shown), and may receive the RF signal through the plurality of antennas. The antenna modules 421, 422, 423, and 424 may down-convert the RF signal into the IF signal utilizing the LO signal, and may transmit the IF signal to the second communication module 452 through the FPCBs 431, 432, 433, and 434. The second communication module 452 may receive the IF signal from the antenna modules 421, 422, 423, and 424 through the FPCBs 431, 432, 433, and 434. The second communication module 452 may down-convert the IF signal into the baseband signal utilizing the LO signal, and may transmit the baseband signal to the processor 440.

According to an embodiment, the second communication module 452 may include various communication circuitry, including, for example, and without limitation, an Intermediate Frequency Integrated Circuit (IFIC). The second communication module 452 may transmit and/or receive a first signal of a frequency band between about 5 GHz and about 15 GHz.

According to an embodiment, at least one of the first antenna module 421, the second antenna module 422, the third antenna module 423, and the fourth antenna module 424 may include, for example, an RFIC. At least one of the first antenna module 421, the second antenna module 422, the third antenna module 423, and the fourth antenna module 424 may, for example, transmit and/or receive a second signal of at least part (e.g., a frequency band between about 24 GHz and about 100 GHz, a frequency band between about 24 GHz and about 30 GHz, or a frequency band between about 37 GHz and about 40 GHz) of a band between about 6 GHz and about 100 GHz.

According to various embodiments, the first antenna module 421, the second antenna module 422, the third antenna module 423, and the fourth antenna module 424 may be disposed adjacent (e.g., within about 10 mm) to a side bezel structure (e.g., the side bezel structure 218 of FIG. 2A or the side bezel structure 310 of FIG. 3), thereby reducing EMI caused by neighboring elements. For example, returning to FIG. 2B, when viewed from above the rear plate 211, the first antenna module 421 may be disposed to an upper left portion, the second antenna module 422 may be disposed to an upper right portion, the third antenna module 423 may be disposed to a lower left portion, and the fourth antenna module 424 may be disposed to a lower right portion.

According to an embodiment, the electronic device 400 may include at least one of the conductive structures 481, 482, 483, and 484 (e.g., each including a conductive material or conductor) which electrically couple a ground layer (not shown) included in the FPCB 431, 432, 433, and 434 to a ground 490. For example, the conductive structures 481, 482, 483, and 484 may include the first conductive structure 481 which electrically couples the ground 490 with the ground layer included in the first FPCB 431, the second conductive structure 482 which electrically couples the ground 490 with a ground layer included in the second FPCB 432, the third conductive structure 483 which electrically couples the ground 490 with a ground layer included in the third FPCB 433, and the fourth conductive structure 484 which electrically couples the ground 490 with a ground layer included in the fourth FPCB 434. According to an embodiment, the ground 490 may be disposed to a PCB (not shown) on which, for example, the communication module 450 or the processor 440 is mounted.

According to an embodiment, if the ground layers of the FPCBs 431, 432, 433, and 434 are electrically coupled with the ground 490 by means of the conductive structures 481, 482, 483, and 484, when IF signals and LO signals are transmitted/received through the FPCBs 431, 432, 433, and 434 between the second communication module 452 and the antenna modules 421, 422, 423, and 424, electromagnetic noise (e.g., electromagnetic wave noise) generated inside the electronic device 400 or introduced from the outside of the electronic device 400 can be prevented from and/or reduce affecting transmission/reception of such a signal. For example, if the ground layers of the FPCBs 431, 432, 433, and 434 are electrically coupled with the ground 490 by means of the conductive structures 481, 482, 483, and 484, Electro Magnetic Interference (EMI) between one or more antennas 460 and the FPCBs 431, 432, 433, and 434 can be decreased.

According to an embodiment, if the ground layers of the FPCBs 431, 432, 433, and 434 are electrically coupled with the ground 490 by means of the conductive structures 481, 482, 483, and 484, EMI between elements may be decreased to reduce a loss for transmission/reception signals (e.g., IF signals and/or LO signals) between the second communication module 452 and the antenna modules 421, 422, 423, and 424.

According to an embodiment, when power, signals, and/or data is transmitted/received through the FPCBs 431, 432, 433, and 434 between the second communication module 452 and the antenna modules 421, 422, 423, and 424, an electromagnetic field may be formed in the FPCBs 431, 432, 433, and 434 due to a current flow. The electromagnetic field may add noise to a peripheral circuit, thereby causing EMI which may interrupt a normal operation of the peripheral circuit. According to an embodiment, when the ground layers of the FPCBs 431, 432, 433, and 434 are electrically coupled with the ground 490 by means of the conductive structures 481, 482, 483, and 484, the EMI can be decreased. For example, the electronic device 400 may include a camera module adjacent to the FPCBs 431, 432, 433, and 434 or disposed around theme. When the ground layers of the FPCBs 431, 432, 433, and 434 are electrically coupled with the ground 490 by means of the conductive structures 481, 482, 483, and 484, an electromagnetic effect for an operational clock of the camera module can be decreased.

According to various embodiments, the first communication module 451 and/or the second communication module 452 may be included in one module together with the processor 440. For example, the first communication module 451 and/or the second communication module 452 may be integrally formed together with the processor 440. According to some embodiments, the first communication module 451 and/or the second communication module 452 may be disposed inside one chip, or may be in a form of an independent chip.

According to an embodiment, the processor 440 and one communication module (e.g., the first communication module 451) may be integrally formed inside one chip (SoC chip), and another single communication module (e.g., the second communication module 451) may be formed as an independent chip.

Figure 5:
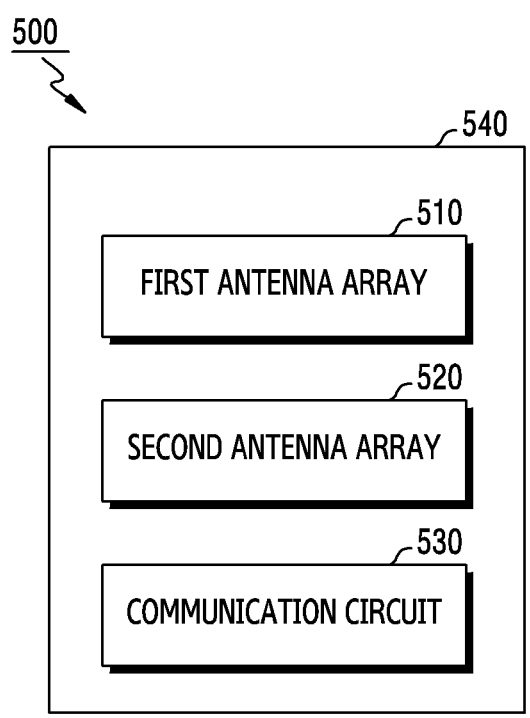
FIG. 5 is a block diagram illustrating an example antenna module according to an embodiment.

FIG. 5 is a block diagram illustrating an example antenna module according to an embodiment.

Referring to FIG. 5, an antenna module (e.g., including at least one antenna) 500 (e.g., the first antenna module 421, second antenna module 422, third antenna module 423, or fourth antenna module 424 of FIG. 4) may include at least one of a first antenna array (e.g., including at least one antenna) 510, a second antenna array (e.g., including at least one antenna) 520, a communication circuit 530, and a PCB 540.

According to an embodiment, at least one of the first antenna array 510, the second antenna array 520, and the communication circuit 530 may be disposed to (e.g., on) the PCB 540. For example, the first antenna array 510 and/or the second antenna array 520 may be disposed to a first face of the PCB 540, and the communication circuit 530 may be disposed to a second face (e.g., a face facing away from the first face) of the PCB 540. The PCB 540 may include a connector for electrically coupling another PCB (e.g., a PCB on which the communication module 450 of FIG. 4 is disposed) using a transmission path (e.g., the FPCB 431, second FPCB 432, third FPCB 433, or fourth FPCB 434 of FIG. 4). The PCB 540 may be coupled through a PCB on which a communication module (e.g., the communication module 450 of FIG. 4.) is disposed and one or more FPCBs (e.g., the FPCBs 431, 432, 433, and 434 of FIG. 4) using, for example, a connector. According to an embodiment, the at least one FPCB may be utilized to transfer an Intermediate Frequency (IF) signal or Radio Frequency (RF) signal for transmission and reception in a corresponding network (e.g., a 5G network). Power and/or other control signals may be transferred through the at least one FPCB.

According to an embodiment, the first antenna array 510 and/or the second antenna array 520 may have a structure in which a plurality of antennas (or antenna elements) having substantially the same shape are arranged or a plurality of antennas are arranged with a specific interval. According to an embodiment, a plurality of antennas included in the first antenna array 510 or the second antenna array 520 may include, for example, and without limitation, a patch antenna, a loop antenna, and/or a dipole antenna, or the like. For example, at least part of the plurality of antennas included in the first antenna array 510 may include a path antenna to form a beam towards a rear plate (e.g., the rear plate 211 of FIG. 2B) of an electronic device (e.g., the electronic device 200 of FIG. 2A or 2B). For example, at least part of the plurality of antennas included in the second antenna array 520 may include a dipole antenna or loop antenna to form a beam towards a side member (e.g., the side bezel structure 218 of FIG. 2A) of the electronic device (e.g., the electronic device 200 of FIG. 2A or 2B).

According to an embodiment, the communication circuit 530 may, for example, transmit and/or receive a second signal of at least part (e.g., a frequency band between about 24 GHz and about 100 GHz, a frequency band between about 24 GHz and about 30 GHz, or a frequency band between about 37 GHz and about 40 GHz) of a band between about 6 GHz and about 100 GHz. According to an embodiment, the communication circuit 530 may up-convert and/or down-convert a frequency for a signal transmitted/received in wireless communication. For example, the communication circuit 530 may receive an IF signal received through an FPCB (e.g., the FPCBs 431, 432, 433, and 434) from a communication module (e.g., the communication module 450 of FIG. 4), and may up-convert the received IF signal into an RF signal. For example, the communication circuit 530 may down-convert an RF signal received through a plurality of antennas included in the first antenna array 510 or second antenna array 520 into an IF signal, and may provide the IF signal to the communication module (e.g., the communication module 450 of FIG. 4).

Figure 6:
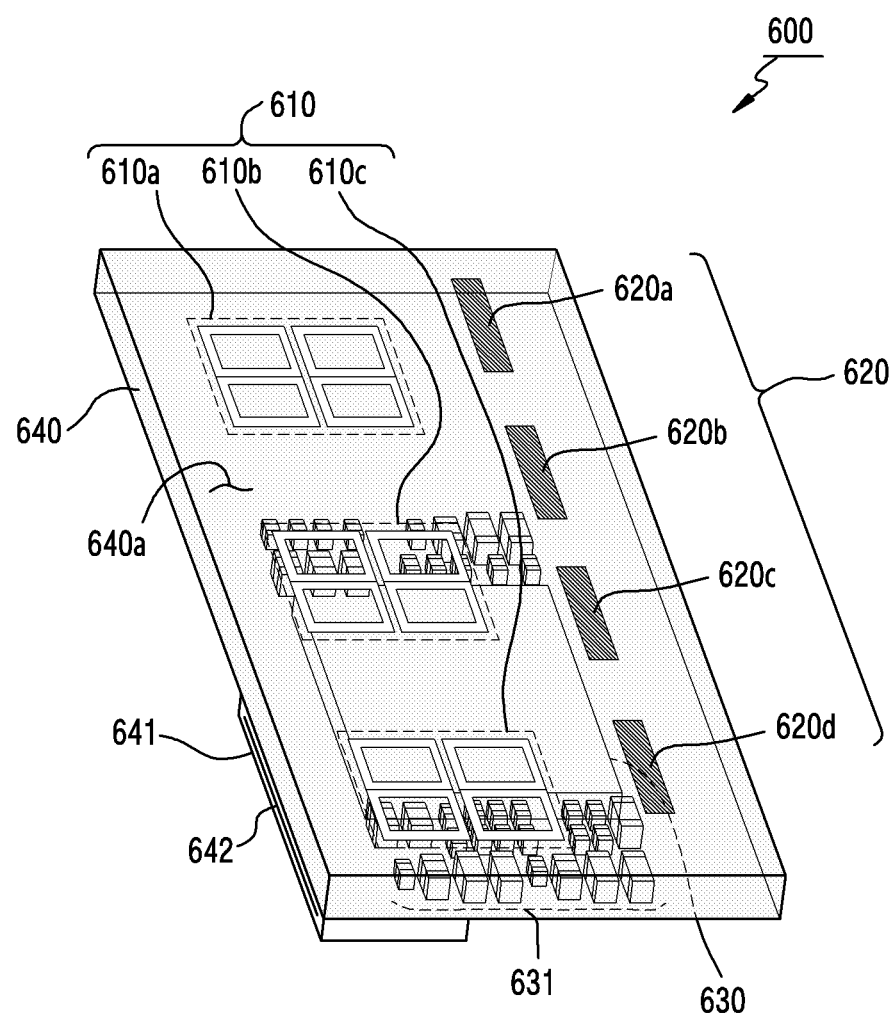
FIG. 6 is a perspective view illustrating an example antenna module according to an embodiment.

FIG. 6 is a perspective view illustrating an example antenna module according to an embodiment.

Referring to FIG. 6, an antenna module (or an antenna structure) 600 (e.g., the antenna module 500 of FIG. 5) may include at least one of a first antenna array 610 (e.g., the first antenna array 510 of FIG. 5), a second antenna array 620 (e.g., the second antenna array 520 of FIG. 5), a communication circuit 630 (e.g., the communication circuit 530 of FIG. 5), and a PCB 640 (e.g., the PCB 540 of FIG. 5).

According to an embodiment, the first antenna array 610 and/or the second antenna array 620 may, for example, be disposed to a first face 640a of the PCB 640, and the communication circuit 630 or various electric elements (e.g., passive elements or active elements) 631 related thereto may, for example, be disposed to a second face (e.g., a face facing away from the first face 640a) of the PCB 640.

According to some embodiments, the first antenna array 610 and/or the second antenna array 620 may be implemented as a circuit included in an inner layer of the PCB 640. The first antenna array 610 and/or the second antenna array 620 may be electrically coupled with the communication circuit 630 through a circuit (or a wiring) of at least one inner layer included in the PCB 640.

According to an embodiment, the PCB 640 may include a structure including inner layers on which a circuit is formed using, for example, Copper Clad Laminates (CCL), first and second outer layers which are disposed at both sides of the inner layers and on which a circuit is formed, and prepregs which bond or isolate one layer from another, and may be electrically coupled through a VIA formed on the PCB 640. According to an embodiment, a circuit included in a first outer layer may include the first antenna array 610 or the second antenna array 620, and a circuit included in a second outer layer may include pads (or terminals) for mounting the communication circuit 630 by using a conductive material such as a solder.

According to some embodiments, the first antenna array 610 and/or the second antenna array 620 may be formed utilizing a conductive paint separately coated on the metal plate PCB 640 separately attached to the PCB 640.

According to an embodiment, the first antenna array 610 and/or the second antenna array 620 may increase an antenna gain by overcoming a high free spatial loss depending on a frequency characteristic, in wireless communication which utilizes, for example, a millimeter wave at least about 20 GHz. The number of antenna elements is not limited to the illustrated example, and may vary by considering an antenna gain or a size of the PCB 640.

According to an embodiment, antenna elements 610a, 610b, and 610c included in the first antenna array 610 may include, for example, a patch antenna. Antenna elements 620a, 620b, 620c, and 620d included in the second antenna array 620 may include, for example, a dipole antenna or a loop antenna. According to an embodiment, when the antenna module 600 is mounted to an electronic device (e.g., the electronic device 200 of FIG. 2A or 2B or the electronic device 300 of FIG. 3), the first antenna array 610 may form a beam towards a rear plate (e.g., the rear plate 211 of FIG. 2B or the rear plate 380 of FIG. 3) of the electronic device, and may form a beam towards a side bezel structure (e.g., the size bezel structure 218 of FIG. 2A or the side bezel structure 310 of FIG. 3) of the electronic device.

According to an embodiment, the antenna module 600 may include a beam forming system which processes a transmission or reception signal so that energy radiated from an antenna element is concentrated in a specific direction in a space. The beam forming system may receive a signal with higher strength in a desired direction or transfer the signal in the desired direction, or may not receive a signal coming from an undesired direction. The beam forming system may adjust a direction and shape of a beam by using an amplitude or phase difference of a carrier signal in an RF band, and according to an embodiment, may include phase shifters for adjusting a phase for each antenna element. According to an embodiment, the beam forming system may control each antenna element to have a phase difference. For example, assuming that the antenna module includes a first antenna element and a second antenna element, a communication circuit (e.g., the communication circuit 630 of FIG. 6) may include a first electrical path electrically coupled with a first point on the first antenna element and a second electrical path electrically coupled with a second point on the second antenna element. The communication circuit may provide a phase difference between a first signal at the first point and a second signal at the second point.

According to an embodiment, the antenna elements 610*a*, 610*b*, 610*c*, 620*a*, 620*b*, 620*c*, and 620*d* may be electrically coupled with the communication circuit 630 through, for example, RF chains. For example, one antenna element may be electrically coupled with the communication circuit 630 in a single feeding manner through one RF chain. For example, one antenna element may be electrically coupled with the communication circuit 630 in a dual feeding manner through two RF chains, and without being limited thereto, may be electrically coupled with the communication circuit 630 in a multi feeding manner trough two or more RF chains. According to an embodiment, a phase shifter may be prepared for each RF chain to perform feeding such that an antenna element has specific phase(s) through RF chain(s).

According to various embodiments, in order to decrease an antenna gain deterioration caused by mutual interference between antenna elements, various feeding structures (e.g., multi-feeding) may be prepared for the first antenna array 610 or the second antenna array 620.

According to various embodiments, one of the first antenna array 610 and the second antenna array may be omitted.

According to various embodiments, the PCB 640 may include an antenna matching circuit. A radiation feature and impedance of the first antenna array 610 or second antenna array 620 may be associated with antenna performance, and may vary depending on a shape and size of the antenna element and a material of the antenna element. The radiation feature of the antenna element may include an antenna radiation pattern (or an antenna pattern) which may be a directivity function exhibiting relative distribution of power radiated from the antenna element, and a polarization state (or an antenna polarization) of a radio wave radiated from the antenna element. Impedance of the antenna element may relate to power transfer from a transmitter to the antenna element or power transfer from the antenna element to a receiver. In order to minimize and/or reduce a reflection at a connection portion between the transmission line and the antenna element, the impedance of the antenna element may be designed to be matched with impedance of the transmission path. Accordingly, maximum/increased power transfer (or power loss minimization/reduction) or effective signal transfer may be possible through the antenna element. Impedance matching may lead to an efficient signal flow at a specific frequency (or a resonant frequency). Impedance mismatching may cause a power loss or a transmission/reception signal decrease, thereby deteriorating communication performance. According to an embodiment, at least one electrical element 631 mounted on the PCB 640 may be utilized as a frequency control circuit for resolving the impedance mismatching. According to an embodiment, the frequency control circuit may shift the resonant frequency to a designated frequency, or may shift the resonant frequency by a designated level.

According to various embodiments, a signal related to wireless communication, power, or other various functions may be transferred from a PCB (e.g., the communication module 450 of FIG. 4 or a PCB having the processor 440 disposed thereon) through an FPCB (e.g., the FPCBs 431, 432, 433, and 434), and one or more electrical elements 631 mounted on the PCB 640 may include passive elements or active elements related to transmission/reception of the signal.

According to an embodiment, the antenna module 600 may include a connector 641 disposed to a second face (a face facing away from the first face 640*a*). One end of the PCBs 431, 432, 433, and 434 of FIG. 4 may include terminals, and may be electrically coupled with the antenna module 600 when inserted to an opening 642 of the connector 641. According to some embodiments, one end of the FPCBs 431, 432, 433, and 434 of FIG. 4 may be electrically coupled with lands (conductive pads) prepared on a second face (a face facing away from the first face 640*a*) using a conductive material such as a solder. In this case, the connector 641 may be omitted.

Figure 7A:
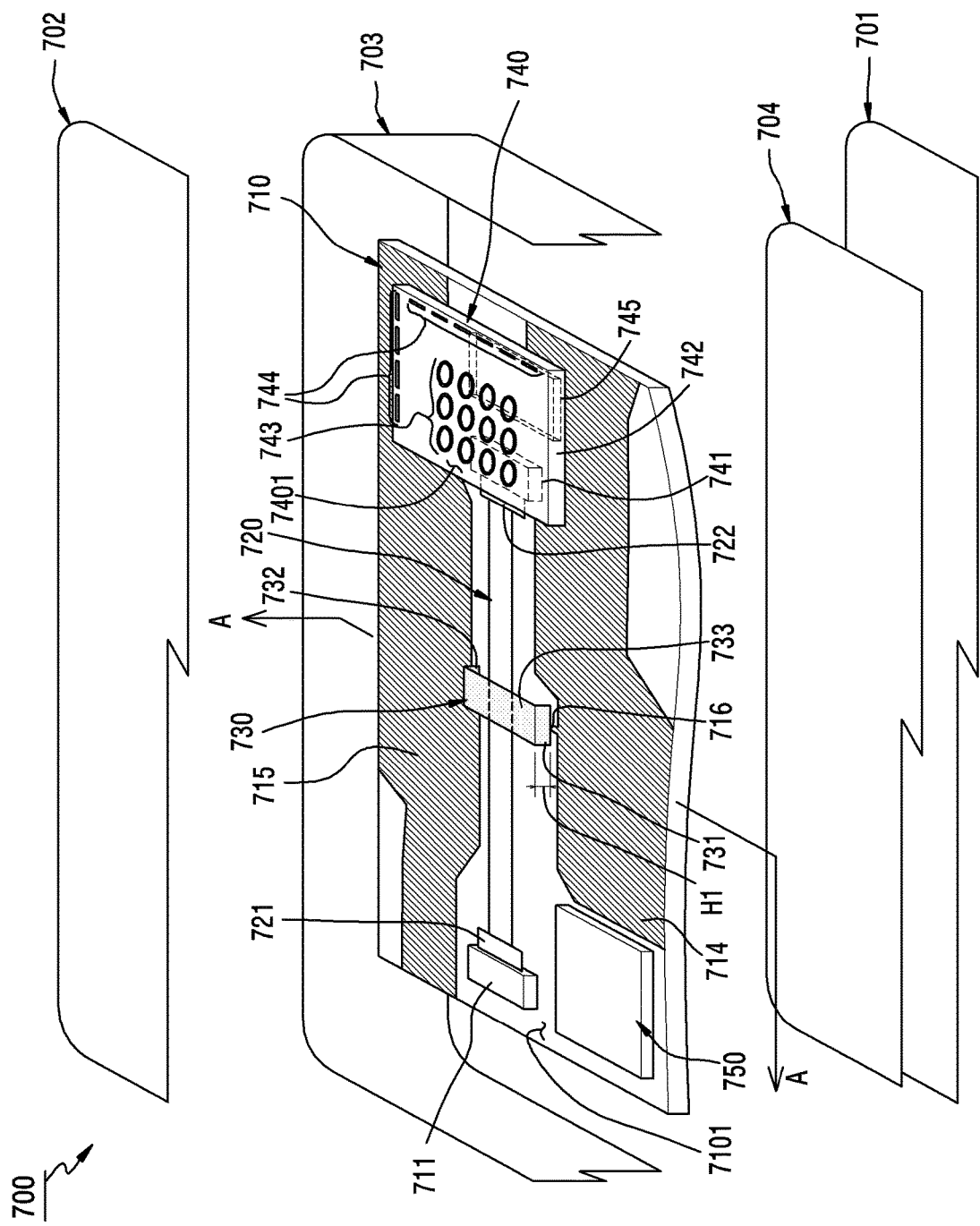
FIG. 7A is an exploded perspective view illustrating an example electronic device according to an embodiment.
Figure 7B:
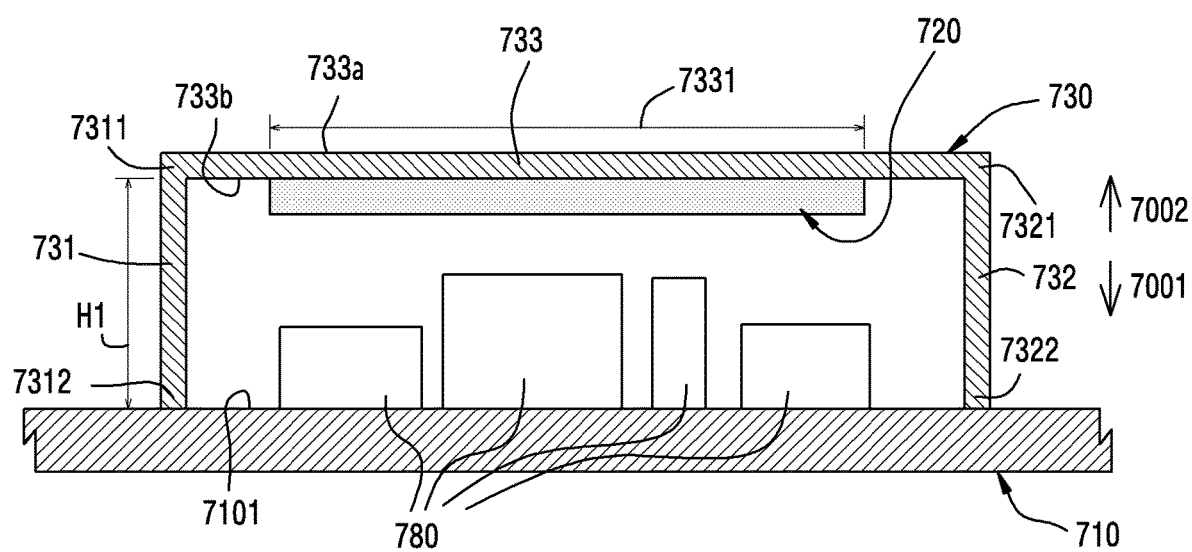
FIG. 7B is a cross-sectional view of a section A-A in FIG. 7A.
Figure 7C:
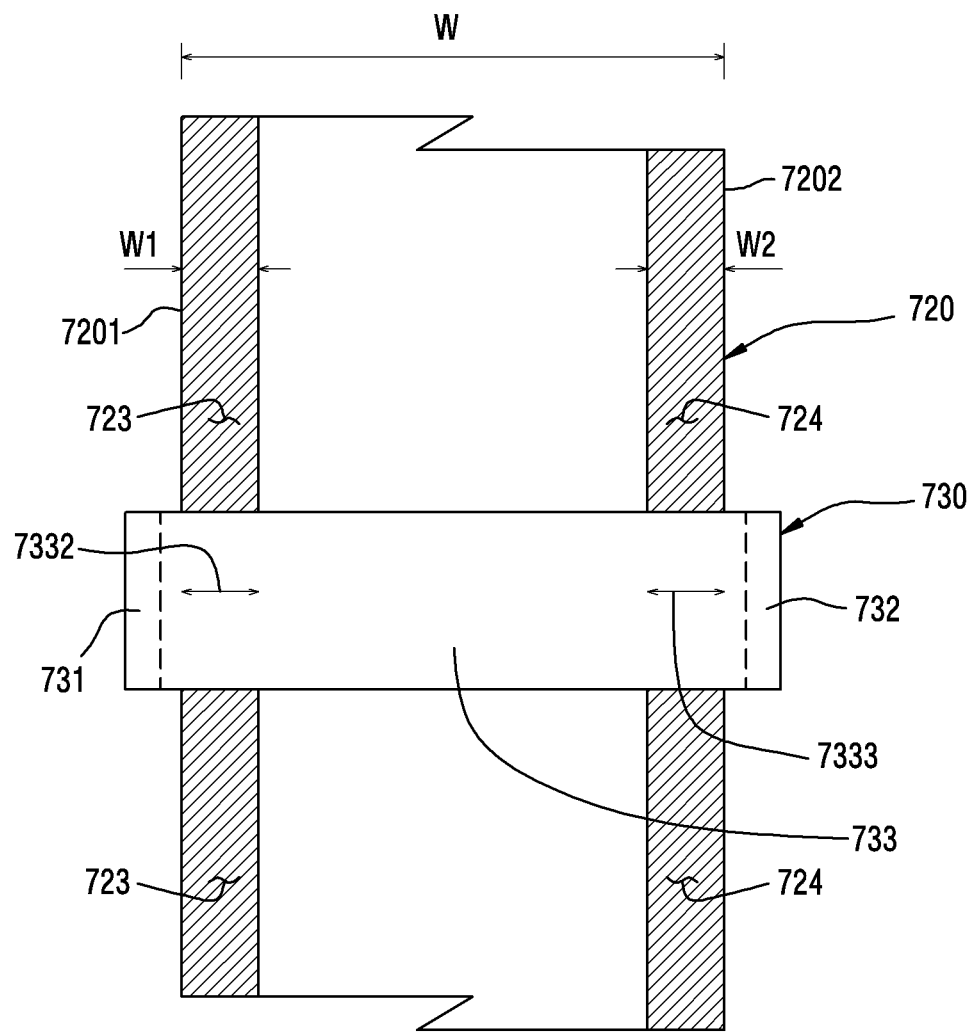
FIG. 7C is a diagram illustrating an example FPCB and an example conductive structure according to an embodiment.

FIG. 7A is an exploded perspective view illustrating an example electronic device according to an embodiment. FIG. 7B is a cross-sectional view of section A-A in FIG. 7A. FIG. 7C is a front view illustrating an example FPCB and an example conductive structure according to an embodiment.

Referring to FIG. 7A, an electronic device 700 (e.g., the electronic device 101 of FIG. 1, the electronic device 200 of FIG. 2A or 2B, the electronic device 300 of FIG. 3, or the electronic device 400 of FIG. 4) may include at least one of housings 701, 702, and 703, a display 704, a first PCB 710, an FPCB 720, a conductive structure (e.g., including a conductive material) 730, an antenna structure (e.g., including at least one antenna) 740, and a first wireless communication circuit 750.

The housings 701, 702, and 703 (e.g., the housing 210 of FIG. 2A or 2B) may include, for example, the first plate 701 (e.g., the front plate 202 of FIG. 2A or the front plate 320 of FIG. 3), the second plate 702 (e.g., the rear plate 211 of FIG. 2B or the rear plate 380 of FIG. 3) facing away from the first plate 701, and the side member 703 (e.g., the side bezel structure 218 of FIG. 2A or 2B or the side bezel structure 310 of FIG. 3) surrounding a space between the first plate 701 and the second plate 702.

The display 704 (e.g., the display 201 of FIG. 2A or the display 330 of FIG. 3) may be exposed, for example, through at least part of the first plate 701.

According to an embodiment, the first PCB 710 may be disposed between the first plate 701 (or the display 704) and the second plate 702. The first PCB 710 may include a third face 7101 and a fourth face (not shown) facing away from the third face 7101. For example, the third face 7101 may face the second plate 702, and the fourth face may face the display 704.

According to an embodiment, the first PCB 710 may include ground patterns, and at least some patterns 714 and 715 of the ground patterns may be formed on the third face 7101, which is an outer layer of the first PCB 710, to comprise a first ground layer. When the plurality of ground patterns 714 and 715 are formed on the third face 7101 to comprise the first ground layer, the plurality of ground patterns 714 and 715 may be electrically coupled through a via (not shown) or another ground layer (not shown). At least some patterns 714 and 715 of the ground patterns according to various embodiments disclosed in the disclosure may be referred to as 'first ground layers'.

According to an embodiment, a first connector 711 which electrically couples a first end 721 of the FPCB 720 may be disposed on the third face 7101 of the first PCB 710. According to an embodiment, the first wireless communication circuit 750 (e.g., the second communication module 452 of FIG. 4) may be disposed on the third face 7101 of the first PCB 710, and may be electrically coupled with the first connector 711. According to some embodiments, the first wireless communication circuit 750 may be disposed to a third PCB (not shown) disposed to overlap with the first PCB 710.

According to an embodiment, the FPCB 720 may include the first end 721 electrically coupled with the first PCB 710 and a second end 722 electrically coupled with the antenna structure 740. For example, the FPCB 720 may, for example, include one of the first FPCB 431, second FPCB 432, third FPCB 433, and fourth FPCB 434 of FIG. 4. The first end 721 may be electrically coupled with the first connector 711, and the second end 722 may be coupled with a second connector 741 included in the antenna structure 740. The antenna structure 740 may be electrically coupled with the first wireless communication circuit 750 mounted on the first PCB 710 through the FPCB 720.

According to an embodiment, the antenna structure 740 (e.g., the first antenna module 41, second antenna module 422, third antenna module 423, and fourth antenna module 424 of FIG. 4 or the antenna module 600 of FIG. 6) may include a second PCB 742 having a first face 7401 and a second face (not shown) facing away from the first face 7401. According to an embodiment, the second PCB 742 may be disposed such that the second face faces the third face 7101 of the first PCB 710. For example, the second PCB 742 may be disposed substantially in parallel with the first PCB 710. According to various embodiments, although not shown, a support member for supporting the second PCB 742 with respect to the first PCB 710 may be disposed between the first PCB 710 and the second PCB 742. According to various embodiments, the insulating support member may include an adhesive a cohesive material (or an adhesive material). According to some embodiments, the second PCB 742 may be joined to the first PCB 710 utilizing a bolt.

According to some embodiments, although not shown, the second PCB 742 may be disposed substantially with an angle of 90 degrees or an acute angle with respect to the first PCB 710. For example, the second PCB 742 may be disposed between the side member 703 and the first PCB 710, and may be perpendicular to the first PCB 710. According to an embodiment, the second PCB 742 may be joined to the side member 703.

According to an embodiment, the second PCB 742 may include at least one of conductive patterns 743 and 744 disposed on the first face 7401. The conductive patterns 743 and 744 may be utilized as antenna radiators, and may include, for example, the first antenna array 743 (e.g., the first antenna array 510 of FIG. 5 or the first antenna array 610 of FIG. 6) and/or the second antenna array 744 (e.g., the second antenna array 520 of FIG. 5 or the second antenna array 620 of FIG. 6).

According to an embodiment, the second PCB 742 may include a second wireless communication circuit 745 (e.g., the communication circuit 530 of FIG. 5 or the communication circuit 630 of FIG. 6) disposed on the second face (e.g., a face facing away from the first face 7401). The second wireless communication circuit 745 may perform wireless communication of a corresponding communication band utilizing the first antenna array 743 and/or the second antenna array 744.

According to an embodiment, the second wireless communication circuit 745 may receive an IF signal from the first wireless communication circuit 750 (e.g., the second communication module 452 of FIG. 4) through the FPCB 720, and may up-convert the received IF signal into an RF signal and transmit the RF signal to the outside through the first antenna array 743 and/or the second antenna array 744.

According to an embodiment, the second wireless communication circuit 745 may down-convert an RF signal (e.g., a millimeter wave signal) received through the first antenna array 743 and/or the second antenna array 744 into an IF signal, and may transmit the IF signal to the first wireless communication circuit 750 (e.g., the second communication module 452 of FIG. 4) through the FPCB 720.

According to an embodiment, the first wireless communication circuit 750 may include an IFIC. For example, the second communication module 452 may transmit and/or receive a first signal of a frequency band between about 5 GHz and about 15 GHz.

According to an embodiment, the second wireless communication circuit 745 may include an RFIC. For example, the second wireless communication circuit 745 may transmit and/or receive a second signal of at least part (e.g., a frequency band between about 24 GHz and about 100 GHz, a frequency band between about 24 GHz and about 30 GHz, or a frequency band between about 37 GHz and about 40 GHz) of a band between about 6 GHz and about 100 GHz.

According to some embodiments, at least part of the first antenna array 743 and/or the second antenna array 744 may be disposed to a second face (e.g., a face facing away from the first face 7401) of the second PCB 742.

According to some embodiments, the second wireless communication circuit 745 may be disposed to the first face 7401 of the second PCB 742. According to various embodiments, the second wireless communication circuit 745 may be disposed to the same face (e.g., the first face 7401 or the second face) as the first antenna array 743 or the second antenna array 744.

According to some embodiments, the first antenna array 743 and/or the second antenna array 744 may be implemented as a circuit included in an inner layer of the second PCB 742. The first antenna array 743 and/or the second antenna array 744 may be electrically coupled with the second wireless communication circuit 745 through a circuit (or a wiring) of at least one inner layer included in the second PCB 742.

According to various embodiments, the second PCB 742 may include a structure including inner layers on which a circuit is formed using Copper Clad Laminates (CCL), first and second outer layers which are disposed at both sides of the inner layers and on which a circuit is formed, and prepregs which bond or isolate one layer from another, and may be electrically coupled through a VIA formed on the second PCB 742. According to an embodiment, a circuit included in a first outer layer may include a first antenna array 743 and/or a second antenna array 744, and a circuit included in a second outer layer may include pads (or terminals) for mounting the second communication circuit 745 by using a conductive material such as a solder.

According to an embodiment, the electronic device 700 may include the conductive structure 730 (e.g., the first conductive structure 481, second conductive structure 482, third conductive structure 483, or fourth conductive structure 484 of FIG. 4) which electrically couples a second ground (not shown) of the FPCB 720 with the first ground layers 714 and 715 (e.g., the ground 490 of FIG. 4) of the first PCB 170.

In an embodiment, the conductive structure 730 may include a first conductive portion 731 electrically coupled at a first position 716 of the first ground layers 714 and 715. The conductive structure 730 may include a second conductive portion 732 electrically coupled at a second position (not shown), different from the first position 716, of the first ground layers 714 and 715. The conductive structure 730 may include a third conductive portion 733 electrically coupled between the first portion 731 and the second portion 732. The third conductive portion 733 may be electrically coupled with the second ground layer of the second PCB 742.

According to an embodiment, the conductive structure 730 may support the FPCB 720, and the FPCB 720 may maintain a state of being spaced apart from the first PCB 710. Referring to FIG. 7A and FIG. 7B, the third conductive portion 733 may couple one end 7311 of the first conductive portion 731 and one end 7321 of the second conductive portion 732, and may be spaced apart by a first height H1 from the third face 7101 of the first PCB 710. For example, the third conductive portion 733 may include a planar plate which is substantially parallel with the third face 7101 of the first PCB 710. According to some embodiments, although not shown, the third conduct portion 733 may be designed not to be parallel with the third face 7101 of the first PCB 710.

According to various embodiments, although not shown, the third conductive portion 733 may be formed in a convex shape in a direction 7002 facing the first plate 701 to the second plate 702 or a direction 7001 opposite to the direction 7002.

According to various embodiments, although not shown, a region 7331 overlapping with the FPCB 720 of the third conductive portion 733 may have a concave shape in the direction 7002 facing the first plate 701 to the second plate 702 or the direction 7001 opposite to the direction 7002. In addition thereto, the third conductive portion 733 may be formed in various other shapes.

Referring to FIG. 7C, in an embodiment, the FPCB 720 may include exposure regions 723 and 724 facing the third conductive portion 733 of the conductive structure 730. The exposure regions 723 and 724 may be electrically coupled with a second ground layer included in the FPCB 720, or may be part of the second ground layer. The FPCB 720 may include a first edge 7201 and second edge 7202 at both sides, which define a width W thereof. According to an embodiment, the exposure regions 723 and 724 may include the first exposure region 723 extended from the first edge 7201 towards the second edge 7202 and the second exposure region 724 extended from the second edge 7202 towards the first edge 7201. Various conductive materials such as a solder or a conductive tape may be disposed between the first exposure region 723 and the portion 7332 of the third conductive portion 733 overlapping therewith and between the second exposure region 724 and the portion 7333 of the third conductive portion 733 overlapping therewith. According to an embodiment, the first exposure region 723 and the second exposure region 724 may be joined with the third conductive portion 733 utilizing ultrasonic welding.

According to various embodiments, one of the first exposure region 723 and the second exposure region 724 may be omitted.

According to various embodiments, a width W1 of the first exposure region 723 and a width W2 of the second exposure region 724 may be identical to or different from each other.

According to various embodiments, the first exposure region 723 or the second exposure region 724 may change to a different position between the first edge 7201 and the second edge 7202.

According to an embodiment, the first exposure region 723 or the second exposure region 724 may be extended from the first end 721 to the second end 722.

According to various embodiments, an exposure region of the FPCB 720 electrically coupled with the third conductive portion 722 may not be limited to a position, size, or count illustrated in FIG. 7C. For example, at least part of a region overlapping with the third conductive portion 733 in the FPCB 720 may be formed as an exposure region.

Referring to FIG. 7A and FIG. 7B, in an embodiment, one end 7312 of the first conductive portion 731 and one end 7322 of the second conductive portion 732 may be electrically coupled with at least part of the first ground layers 714 and 715. For example, the end 7312 of the first conductive portion 731 and the end 7322 of the second conductive portion 732 may be electrically coupled with the first ground layers 714 and 715 by using a conductive material such as a solder. According to an embodiment, the first PCB 710 may include a land (not shown) which is a portion to be joined with the end 7312 of the first conductive portion 731 by using a conductive material such as a solder. The first PCB 710 may include a land (not shown) which is a portion to be joined with the end 7322 of the second conductive portion 732 by using a conductive material such as a solder.

Referring to FIG. 7A and FIG. 7B, in an embodiment, the FPCB 720 may be electrically coupled with a rear face 733b (e.g., a face facing the third face 7101 of the first PCB 710) of the third conductive portion 733. According to some embodiments, although not shown, the FPCB 720 may be electrically coupled with a front face 733a (e.g., the rear plate 702) of the third conductive portion 733.

According to an embodiment, if a second ground layer of the FPCB 720 is electrically coupled with the first ground layers 714 and 715 of the first PCB 710 by means of the conductive structure 730, when signals (e.g., IF signals and LO signals) are transmitted and/or received through the FPCB 720 between the first wireless communication circuit 750 and the antenna structure 730, electromagnetic noise generated inside the electronic device 700 and/or introduced from the outside of the electronic device 700 can be prevented from and/or may reduce affecting transmission and/or reception of such a signal.

According to an embodiment, if a second ground layer of the FPCB 720 is electrically coupled with the first ground layers 714 and 715 of the first PCB 710 by means of the conductive structure 730, EMI between the FPCB 720 and its peripheral circuit (e.g., electronic components 780 at least partially overlapping with the FPCB 720 of FIG. 7B) can be decreased.

According to an embodiment, if the second ground layer of the FPCB 720 is electrically coupled with the first ground layers 714 and 715 of the first PCB 710 by means of the conductive structure 730, a loss can be decreased for transmission/reception signals (e.g., IF signals and/or LO signals) between the first wireless communication circuit 750 and the antenna structure 740.

According to various embodiments, a conductive structure for decreasing EMI may not be limited to the position or count of FIG. 7A.

Figure 8A:
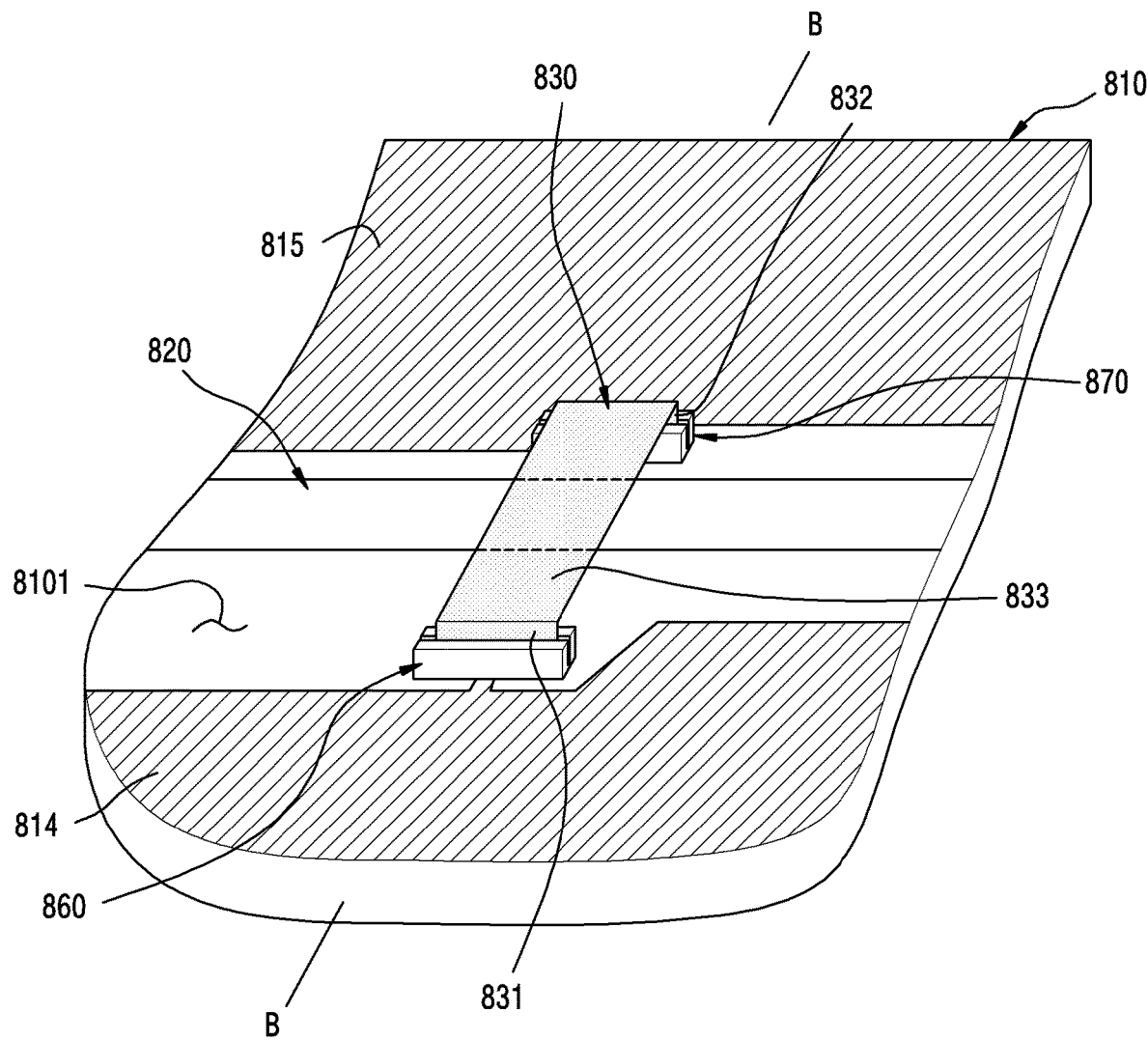
FIG. 8A is a perspective view illustrating an example first PCB, an example FPCB, and an example conductive structure according to an embodiment.
Figure 8B:
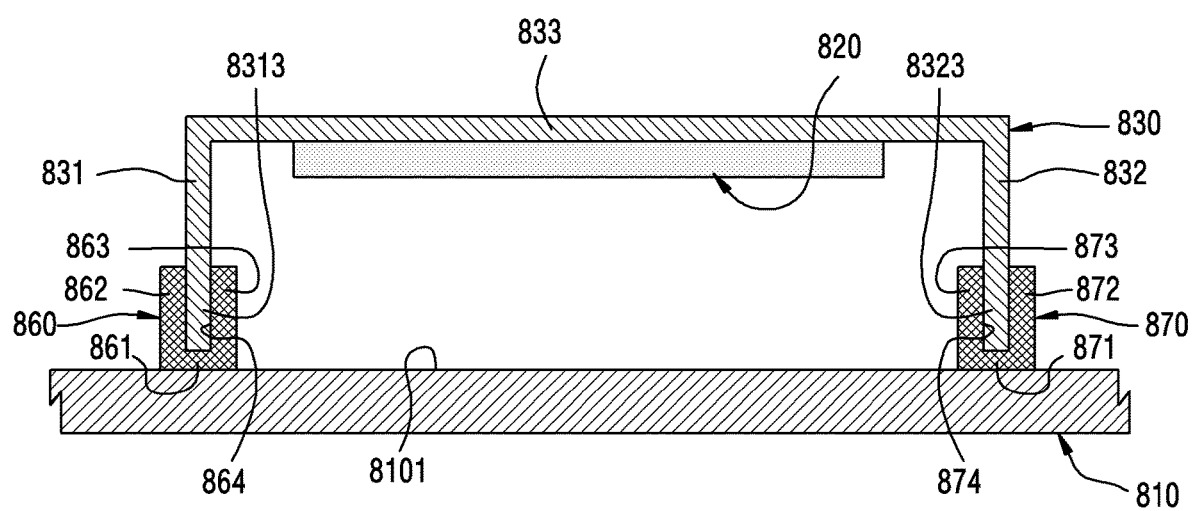
FIG. 8B is a cross-sectional view of section B-B in FIG. 8A.

FIG. 8A is a perspective view illustrating an example first PCB, an example FPCB, and an example conductive structure according to an embodiment. FIG. 8B is a cross-sectional view of section B-B in FIG. 8A.

Referring to FIG. 8A, in an embodiment, a first PCB 810 (e.g., the first PCB 710 of FIG. 7A) may include ground patterns, and at least some patterns 814 and 815 of the ground patterns may be formed on a third face 8101, which is an outer layer of the first PCB 810, to comprise a first ground layer. When the plurality of ground patterns 814 and 815 are formed on the third face 8101 to comprise the first ground layer, the plurality of ground patterns 814 and 815 may be electrically coupled through a via (not shown) or another ground layer (not shown). At least some patterns 814 and 815 of the ground patterns according to various embodiments disclosed in the disclosure may be referred to as 'first ground layers'.

According to an embodiment, a third connector 860 and fourth connector 870 electrically coupled with the first ground layers 814 and 815 may be disposed on the third face 8101 of the first PCB 810. The third connector 860 may be electrically connected at a first position (not shown) of the first ground layers 814 and 815, and the fourth connector 870 may be electrically coupled at a second position (not shown) different from the first position of the first ground layers 814 and 815.

According to an embodiment, a conductive structure 830 may include a first conductive portion 831 electrically coupled with the third connector 860. The conductive structure 830 may include a second conductive portion 832 electrically coupled with the fourth connector 870. The conductive structure 830 may include a third conductive portion 833 electrically coupled between the first portion 831 and the second portion 832.

According to an embodiment, an FPCB 820 (e.g., the FPCB 720 of FIG. 7A) may be disposed between the third conductive portion 833 and the third face 8101 of the first PCB 810, and may be electrically coupled with a rear face (e.g., a face facing the third face 8101) of the third conductive portion 833. For example, a second ground layer (not shown) of the FPCB 820 may be electrically coupled with the third conductive portion 833, and thus may be electrically coupled with the first ground layers 814 and 815 of the first PCB 810 through the conductive structure 830.

According to an embodiment, the third conductive portion 833 and the second ground layer of the FPCB 820 may be electrically coupled utilizing, for example, the embodiment of FIG. 7C. For example, the FPCB 820 may include at least one exposure region (e.g., the exposure regions 723 and 724) facing the third conductive portion 833. A conductive material may be disposed between the third conductive portion 833 and at least one exposure region, and thus the FPCB 820 may be electrically coupled with the third conductive portion 833 while being joined to the third conductive portion 833.

Referring to FIG. 8A and FIG. 8B, in an embodiment, the third connector 860 may include a plate 861 disposed on the third face 8101 of the first PCB 810 and electrically coupled with the first ground layers 814 and 815 and a first side wall 862 and second side wall 863 extended from both edges of the plate 861 to face each other. For example, the plate 861, the first side wall 862, and the second side wall 863 may be integrally constructed with a conductive material. The third connector 860 may include a recess 864 formed by the plate 861, the first side wall 862, and the third side wall 863. If a portion 8313 of the first conductive portion 831 is inserted to the recess 864, the first conductive portion 831 may be physically in contact with the plate 861, the first side wall 862, or the second side wall 863.

According to an embodiment, the first side wall 862 or the second side wall 863 may be designed to elastically press one portion 8313 of the first conductive portion 831 inserted to the recess 864, thereby improving electrical connectivity between the third connector 860 and the first conductive portion 831.

According to an embodiment, the fourth connector 870 may provide a recess 874 by including a plate 871, a first side wall 872, and a second side wall 873, substantially similarly to the third connector 860. If one portion 8323 of the second conductive portion 832 is inserted to the recess 874, it may be electrically coupled with the fourth connector 870. According to various embodiments, the third connector 860 and/or the fourth connector 870 may, for example, be a metal clip.

According to an embodiment, the FPCB 820 may be joined with the third conductive portion 833 of the conductive structure 830, and the conductive structure 830 may be utilized as a support which props the FPCB 820, thereby providing a robust structure between the FPCB 820 and the PCB 810.

Figure 9A:
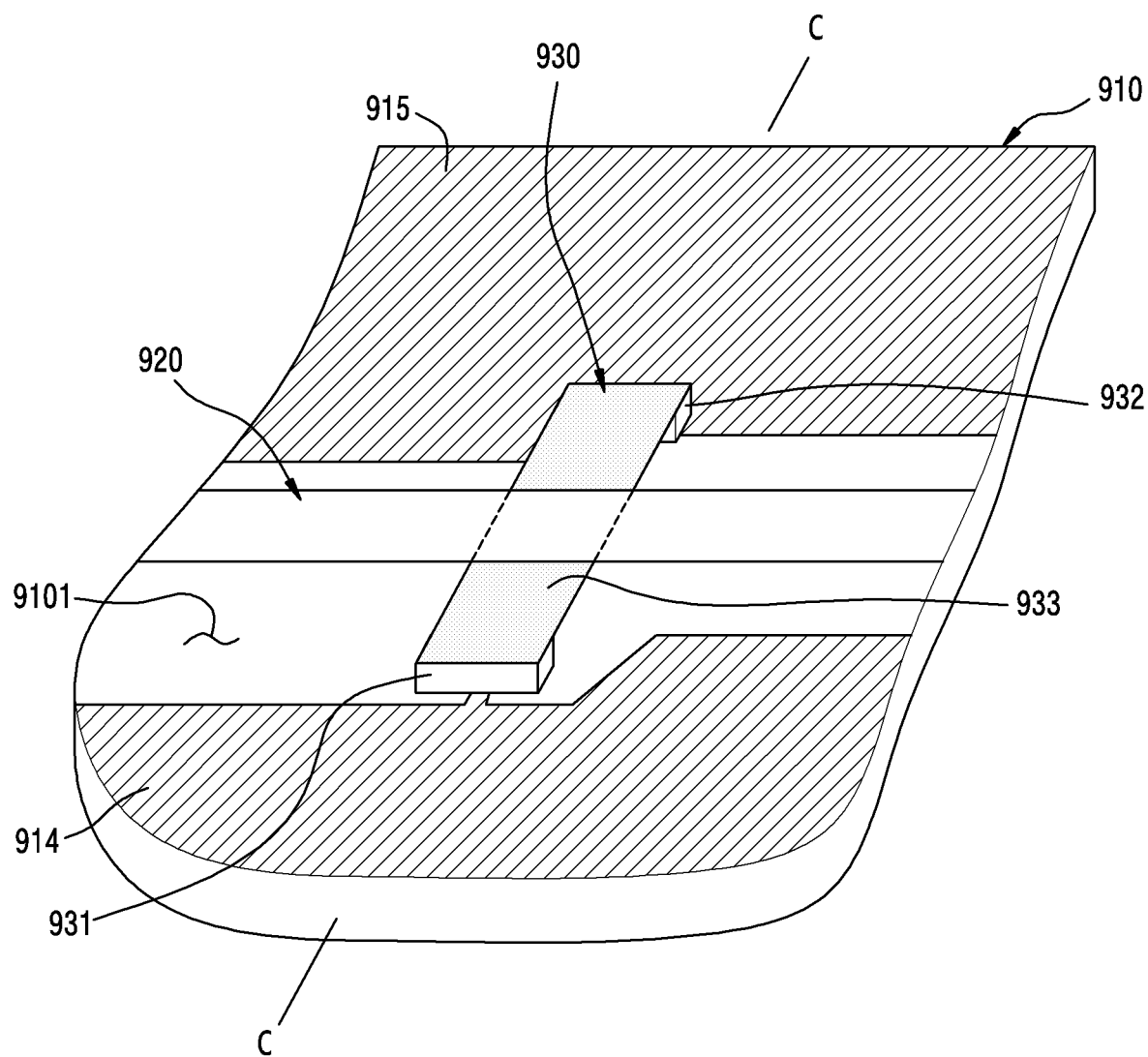
FIG. 9A is a perspective view illustrating an example first PCB, an example FPCB, and an example conductive structure according to an embodiment.
Figure 9B:
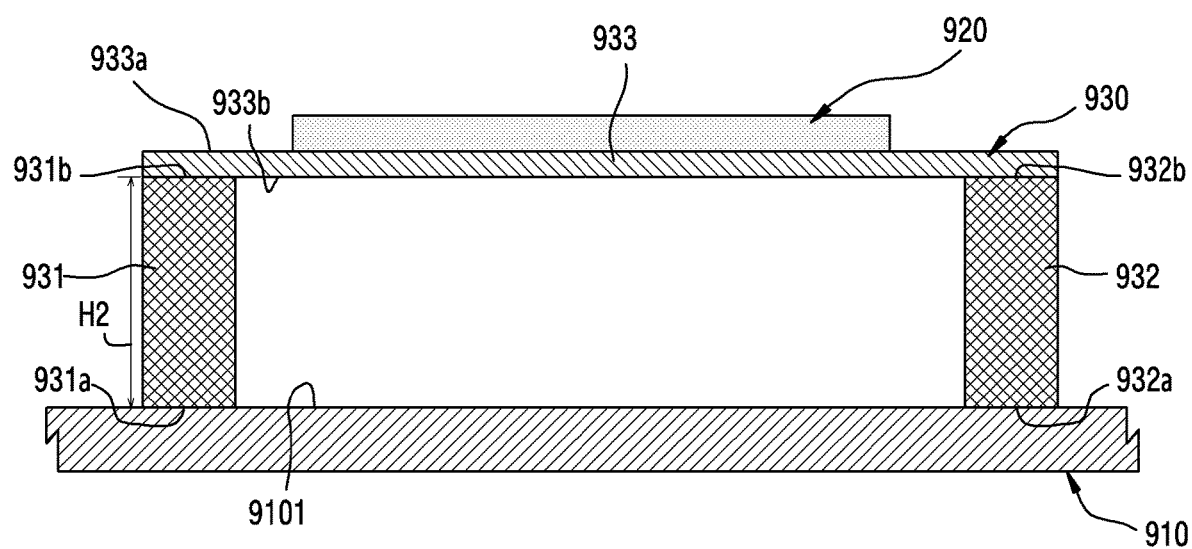
FIG. 9B is a cross-sectional view of section C-C in FIG. 9A.

FIG. 9A is a perspective view illustrating an example first PCB, an example FPCB, and an example conductive structure according to an embodiment. FIG. 9B is a cross-sectional view of section C-C in FIG. 9A.

Referring to FIG. 9A, in an embodiment, a first PCB 910 (e.g., the first PCB 710 of FIG. 7A) may include ground patterns, and at least some patterns 914 and 915 of the ground patterns may be formed on a third face 9101, which is an outer layer of the first PCB 910, to comprise a first ground layer. When the plurality of ground patterns 914 and 915 are formed on the third face 9101 to comprise the first ground layer, the plurality of ground patterns 914 and 915 may be electrically coupled through a via (not shown) or another ground layer (not shown). At least some patterns 914 and 915 of the ground patterns according to various embodiments disclosed in the disclosure may be referred to as 'first ground layers'.

According to an embodiment, a conductive structure 930 may include a first conductive member 931 and second conductive member 932 disposed on the third face 9101 (e.g., the third face 7101 of FIG. 7A) of the first PCB 910. For example, the first conductive member 931 may be electrically coupled at a first position (not shown) of the first ground layers 914 and 915, and the second conductive member 932 may be electrically coupled at a second position (not shown) different from the first position of the first ground layers 914 and 915. The conductive structure 930 may include a conductive plate 933 electrically coupled with the first conductive member 931 and the second conductive member 932, and the conductive plate 933 may be spaced apart from the third face 9101 of the first PCB 910.

Referring to FIG. 9A and FIG. 9B, the first conductive member 931 may include a fifth face 931*a* facing the third face 9101, and the fifth face 931*a* may be electrically coupled with the first ground layers 914 and 915. The first conductive member 931 may include a sixth face 931*b* facing away from the fifth face 931*a*, and the sixth face 931*b* may be disposed at a position spaced apart by a second height H2 from the third face 9101. The sixth face 931*b* may face a rear face 933*b* of the conductive plate 933, and may be electrically coupled therewith.

According to an embodiment, the second conductive member 932 may include a fifth face 932*a* electrically coupled with the first ground layers 914 and 915 and a sixth face 932*b* electrically coupled with the conductive plate 933, substantially similarly to the first conductive member 931.

According to an embodiment, the conductive plate 933 (e.g., the FPCB 720 of FIG. 7A or the FPCB 820 of FIG. 8A) may include the rear face 933*b* facing an FPCB 920 and a front face 933*a* facing away from the rear face 933*b*. According to an embodiment, the FPCB 920 may be disposed on the front face 933*a* of the conductive plate 933, and may be electrically coupled with the conductive plate 933. For example, a second ground (not shown) of the FPCB 920 may be electrically coupled with the first ground layers 914 and 915 of the first PCB 910 through the conductive structure 930.

According to other embodiments, the FPCB 920 (e.g., the FPCB 720 of FIG. 7A or the FPCB 820 of FIG. 8A) may be disposed between the conductive plate 833 and the third face 9101 of the first PCB 910, and may be electrically coupled with the rear face 933*b* of the plate 933.

According to an embodiment, the plate 933 and the second ground layer of the FPCB 920 may be electrically coupled utilizing the embodiment of FIG. 7C. For example, the FPCB 920 may include at least one exposure region (e.g., the exposure regions 723 and 724) facing the conductive portion 933. A conductive material may be disposed between the conductive portion 933 and at least one exposure region, and thus the FPCB 920 may be electrically coupled with the conductive portion 933 while being joined to the conductive portion 933. According to an embodiment, the conductive structure 930 may be utilized as a support which props the FPCB 920, thereby providing a robust structure between the FPCB 920 and the PCB 910.

According to various embodiments, the first conductive member 931 or the second conductive member 932 may include a non-conductive housing (not shown), the fifth faces 931*a* and 932*a* of the non-conductive housing, and a conductor for providing electrically coupling between the sixth faces 931*b* and 932*b* of the housing. For example, the conductor may include a first terminal disposed on the fifth faces 931*a* and 932*b* of the non-conductive housing, a second terminal disposed on the sixth faces 931*b* and 932*b* of the non-conductive housing, and a conductive path disposed on an outer face of the non-conductive housing or inside thereof to electrically couple the first terminal and the second terminal. According to various embodiments, the first conductive member 931 or the second conductive member 932 may be an interposer, a connector, or a coupling member.

According to various embodiments, the first conductive member 931 and/or the second conductive member 932 may include a PCB formed together with the first PCB 910 or formed separately from the first PCB 910. For example, the first conductive member 931 or the second conductive member 932 may be a PCB including one or more inner layers on which a circuit is formed by using a CCL.

Figure 10A:
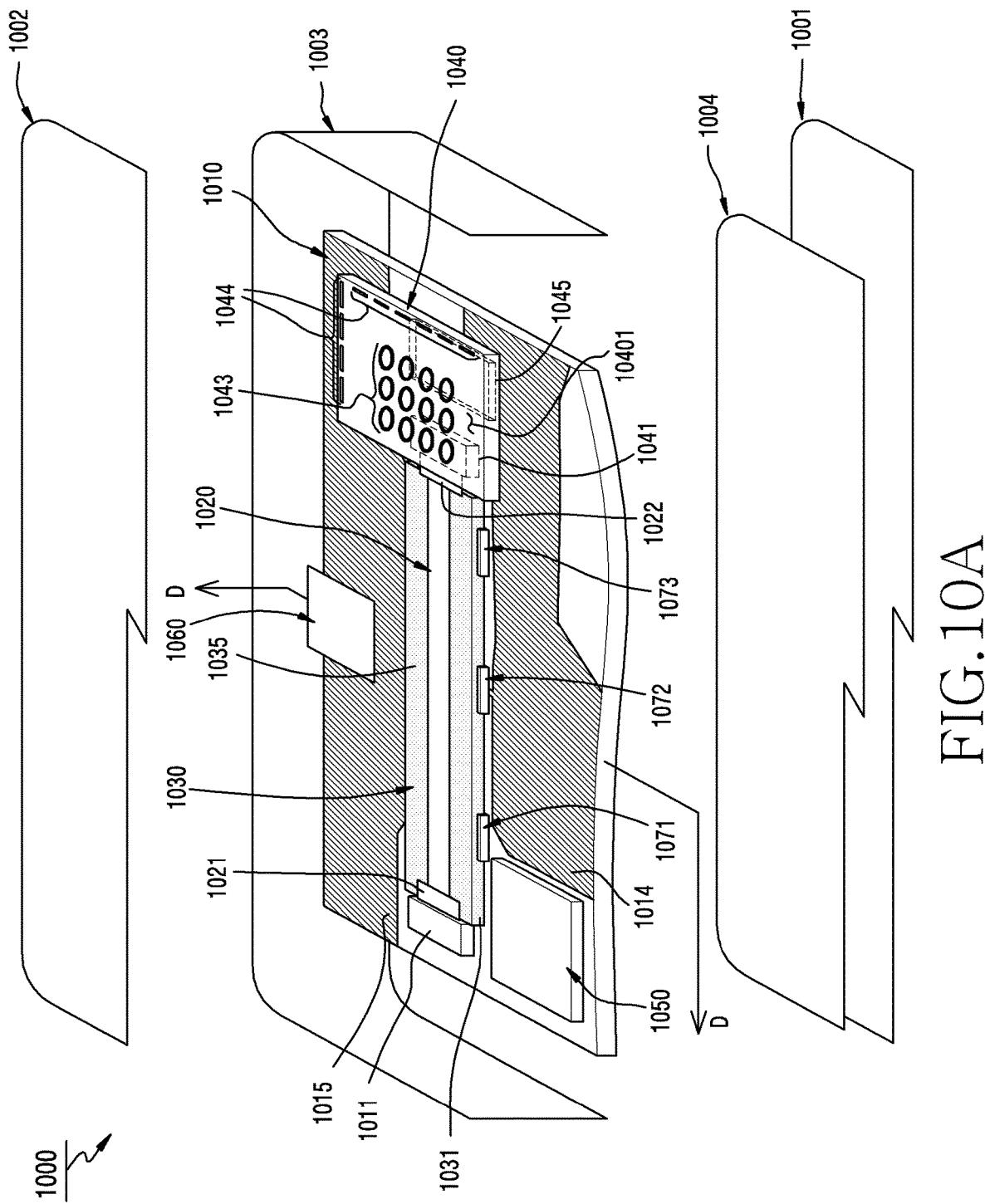
FIG. 10A is an exploded perspective view illustrating an example electronic device including an example conductive structure for electrically coupling a ground layer of an FPCB and a ground layer of a PCB according to an embodiment.
Figure 10B:
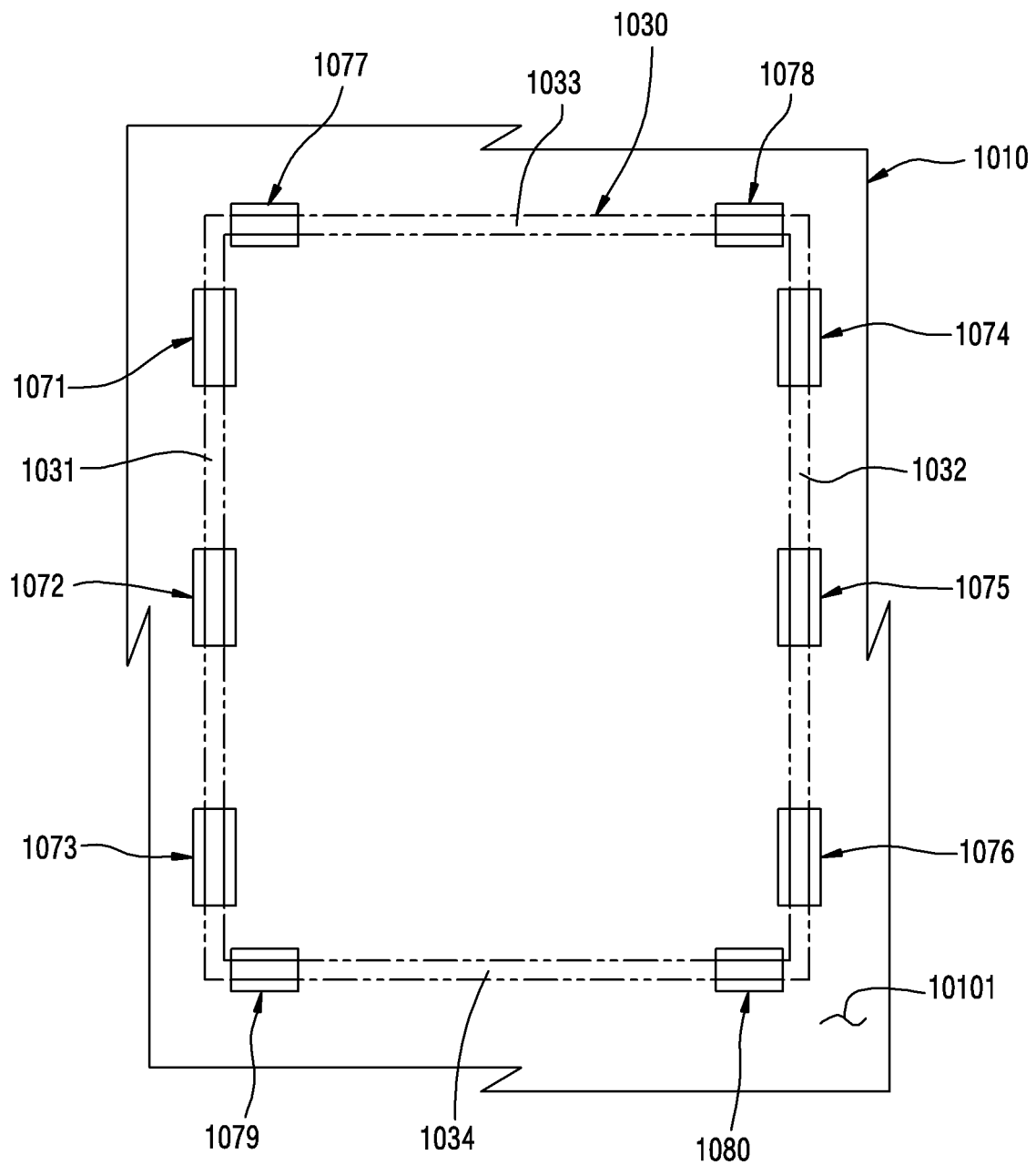
FIG. 10B is a diagram illustrating an example first PCB and an example conductive structure in the electronic device of FIG. 10A.
Figure 10C:
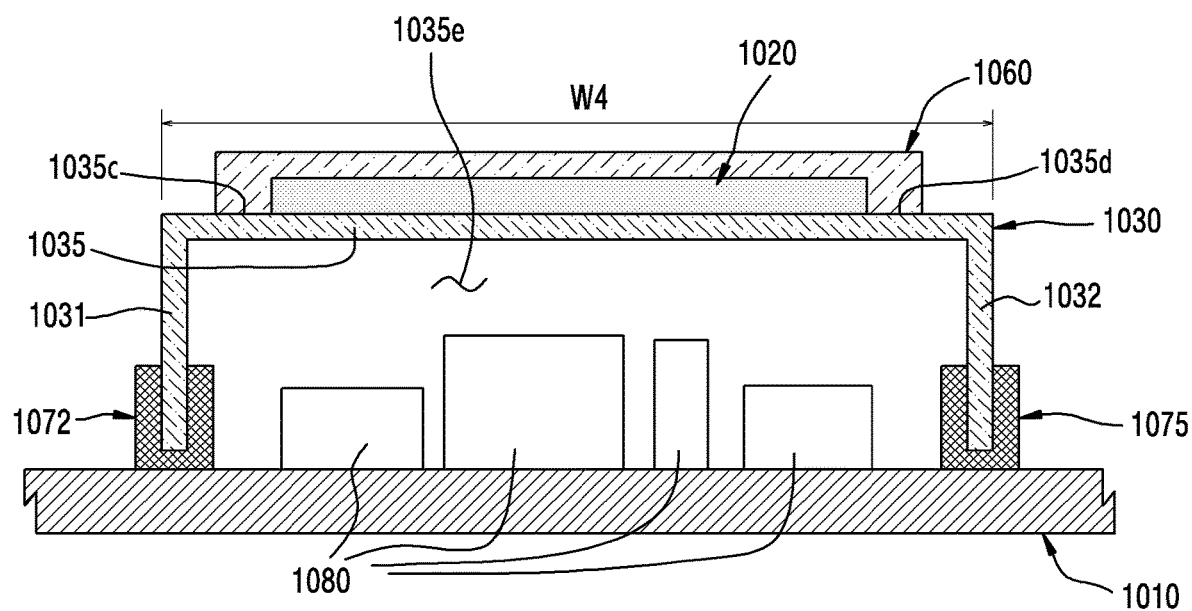
FIG. 10C is a cross-sectional view of section D-D in FIG. 10A.

FIG. 10A is an exploded perspective view illustrating an example electronic device including an example conductive structure for electrically coupling a ground layer of an FPCB and a ground layer of a PCB according to an embodiment. FIG. 10B is a front view illustrating an example first PCB and an example conductive structure in the electronic device of FIG. 10A. FIG. 10C is a cross-sectional view of section D-D in FIG. 10A.

Referring to FIG. 10A, an electronic device 1000 (e.g., the electronic device 101 of FIG. 1, the electronic device 200 of FIG. 2A or 2B, the electronic device 300 of FIG. 3) may include at least one of housings 1001, 1002, and 1003, a display 1004, a first PCB 1010, an FPCB 1020, a metal cover 1030, a metal sheet (or a metal plate) 1060, an antenna structure 1040, and a first wireless communication circuit 1050.

The housings 1001, 1002, and 1003 may be similar or identical to, for example, the housings 701, 702, and 703 of FIG. 7A. The housings 1001, 1002, and 1003 may include the first plate 1001 (e.g., the first plate 701 of FIG. 7A), the second plate 1002 (e.g., the second plate 702 of FIG. 7A), and/or the side bezel structure 1003 (e.g., the side member 703 of FIG. 7A).

The display 1040 may be similar or identical to, for example, the display 704 of FIG. 7A, and may be exposed through at least part of the first plate 1001.

The first PCB 1010 may be similar or identical to, for example, the first PCB 710 of FIG. 7A. The first PCB 1010 may be disposed between the first plate 1001 (or the display 1004) and the second plate 1002, and may include at least one of first ground layers 1014 and 1015 (e.g., the ground 490 of FIG. 4, or the first ground layers 714 and 715 of FIG. 7A).

The FPCB 1020 may be similar or identical to, for example, the FPCB 720 of FIG. 7A. The FPCB 1020 may include a first end 1021 (e.g., the first end 721 of FIG. 7A) electrically coupled with a first connector 1011 (e.g., the first connector 711 of FIG. 7A) mounted on the first PCB 1010 and a second end 1022 (e.g., the second end 722 of FIG. 7A) electrically coupled with a second connector 1041 (e.g., the second connector 741 of FIG. 7A) mounted on the antenna structure 1040 (e.g., the antenna structure 740 of FIG. 7A).

The antenna structure 1040 may be similar or identical to, for example, the antenna structure 740 of FIG. 7A. The antenna structure 1040 may include one or more conductive patterns 1043 and 1044 (e.g., the conductive patterns 743 and 744 of FIG. 7A) disposed to a first face 10401 and a second wireless communication circuit 1045 (e.g., the second wireless communication circuit 745 of FIG. 7A) disposed to a second face (e.g., a face facing away from the first face 10401). The antenna structure 1040 may be electrically coupled with the first wireless communication circuit 1050 of the first PCB 1010 through the FPCB 1020. According to an embodiment, the first wireless communication circuit 1050 may be similar or identical to the first wireless communication circuit 750 of FIG. 7A.

According to an embodiment, the metal cover 1030 and the metal sheet 1060 may utilize a second ground layer of the FPCB 1020 to provide electrical coupling with the first ground layers 1014 and 1015 of the first PCB 1010. For example, a conductive structure including the metal cover 1030 and the metal sheet 1060 may include at least one of the first conductive structure 481, second conductive structure 482, third conductive structure 483, and fourth conductive structure 484 of FIG. 4.

Referring to FIG. 10A and FIG. 10B, in an embodiment, the metal cover 1030 may include at least one of conductive side walls 1031, 1032, 1033, and 1034 electrically coupled with the first ground layers 1014 and 1015. The conductive side walls 1031, 1032, 1033, and 1034 may include the first side wall 1031, the second side wall 1032 separated from the first side wall 1031, the third side wall 1033 for coupling one end of the first side wall 1031 and one end of the second side wall 1032, and the fourth side wall 1034 for coupling the other end of the first side wall 1031 and the other end of the second side wall 1032. For example, the first side wall 1031 and the second side wall 1032, or the third side wall 1033 and the fourth side wall 1034 may be parallel with each other. According to various embodiments, part of the first side wall 1031, the second side wall 1032, the third side wall 1033, or the fourth side wall 1045 may be omitted.

According to an embodiment, the electronic device 1000 may include at least one of a plurality of connectors 1071, 1072, 1073, 1074, 1075, 1076, 1077, 1078, 1079, and 1080 mounted to the first PCB 1010. The plurality of connectors 1071, 1072, 1073, 1074, 1075, 1076, 1077, 1078, 1079, and 1080 may be electrically coupled with the first ground layers 1014 and 1015 of the first PCB 1010, and may be similar or identical to, for example, the first connector 860 or second connector 870 of FIG. 8A or 8B. The conductive side walls

1031, 1032, 1033, and 1034 of the metal cover 1030 may be joined with the plurality of connectors 1071, 1072, 1073, 1074, 1075, 1076, 1077, 1078, 1079, and 1080 and thus may be electrically coupled with the first ground layers 1014 and 1015. According to various embodiments, positions or the number of connectors are not limited to those illustrated in FIG. 10B.

According to an embodiment, the metal cover 1030 may include a conductive third plate 1035 extended from edges of the conductive side walls 1031, 1032, 1033, and 1034, and the third plate 1035 may be separated from the first PCB 1010.

Referring to FIG. 10A and FIG. 10C, in an embodiment, the metal sheet 1060 may be disposed between the conductive third plate 1035 and the second plate 1002, and may be joined with the conductive third plate 1035. According to an embodiment, at least part of the FPCB 1020 may be disposed between the metal sheet 1060 and the conductive third plate 1035. For example, the conductive third plate 1035 may be extended along the FPCB 1020, and may have a width W4 wider than that of the FPCB 1020. According to various embodiments, the conductive third plate 1035 may not be limited to a size illustrated in FIG. 10A.

Referring to FIG. 10C, in an embodiment, the second ground layer of the FPCB 1020 may be electrically coupled with the metal cover 1030 by means of the metal sheet 1060. For example, in the conductive third plate 1035, some portions 1035c and 1035d of a region not overlapping with the FPCB 1020 may be electrically coupled to face the metal sheet 1060. For example, a conductive material may be disposed between the conductive third plate 1035 and the metal sheet 1060, and thus the metal cover 1030 and the metal sheet 1060 may be electrically coupled. The metal sheet 1060 may be electrically coupled with the second ground layer of the FPCB 1020. According to an embodiment, the metal sheet 1060 and the second ground of the FPCB 1020 may be electrically coupled utilizing the embodiment of FIG. 7C. For example, the FPCB 1020 may include at least one exposure region (e.g., the exposure regions 723 and 724) facing the metal sheet 1060. A conductive material may be disposed between the metal sheet 1060 and at least one exposure region, and the second ground of the FPCB 1020 may be electrically coupled with the metal sheet 1060.

According to various embodiments, the metal sheet may not be limited to a position, size, or count illustrated in FIG. 10A.

According to some embodiments, the metal sheet 1060 may be omitted, and a second ground layer of the FPCB 1020 may be electrically coupled with the metal cover 1030. For example, the FPCB 1020 may include at least one exposure region (e.g., the exposure regions 723 and 724 of FIG. 7C) facing the conductive third plate 1035. A conductive material may be disposed between the conductive third plate 1035 and the at least one exposure region, and thus the second ground layer of the FPCB 1020 may be electrically coupled with the metal cover 1030.

According to an embodiment, if the second ground layer of the FPCB 1020 is electrically coupled with the first ground layers 1014 and 1015 of the first PCB 1010 through the metal cover 1030 and the metal sheet 1060, when signals (e.g., IF signals and LO signals) are transmitted/received through the FPCB 1020 between the first wireless communication circuit 1050 and the antenna structure 1040, electromagnetic noise generated from the inside of the electronic device 1000 or introduced from the outside of the electronic device 1000 can be prevented from and/or reduce affecting transmission/reception of such a signal.

According to an embodiment, if the second ground layer of the FPCB 1020 is electrically coupled with the first ground layers 1014 and 1015 of the first PCB 1010 by means of the metal cover 1030 and the metal sheet 1060, EMI between the FPCB 1020 and its peripheral circuit can be decreased.

For example, referring to FIG. 10C, in an embodiment, the metal cover 1030 may provide an electromagnetic shield space 1035e formed by the conductive side walls 1031, 1032, 1033, and 1034 and the conductive plate 1035. The at least one electronic element 1080 mounted to the first PCB 1010 may be disposed to the electromagnetic shield space 1035e. The metal cover 1030 and the metal sheet 1060 may decrease EMI between the FPCB 1020 and at least one electronic element 1080 by electrically coupling the second ground of the FPCB 1020 and the first ground layers 1014 and 1015 of the first PCB 1010.

According to an embodiment, if the second ground layer of the FPCB 1020 is electrically coupled with the first ground layers 1014 and 1015 of the first PCB 1010 by means of the metal cover 1030 and the metal sheet 1060, EMI between elements may be decreased to reduce a loss for transmission/reception signals (e.g., IF signals and/or LO signals) between the first wireless communication circuit 1050 and the antenna structure 1040.

According to various embodiments, various other conductive structures for expanding a ground may be electrically coupled between the second ground layer of the FPCB 1020 and the first ground layers 1014 and 1015 of the first PCB 1010.

Figure 11:
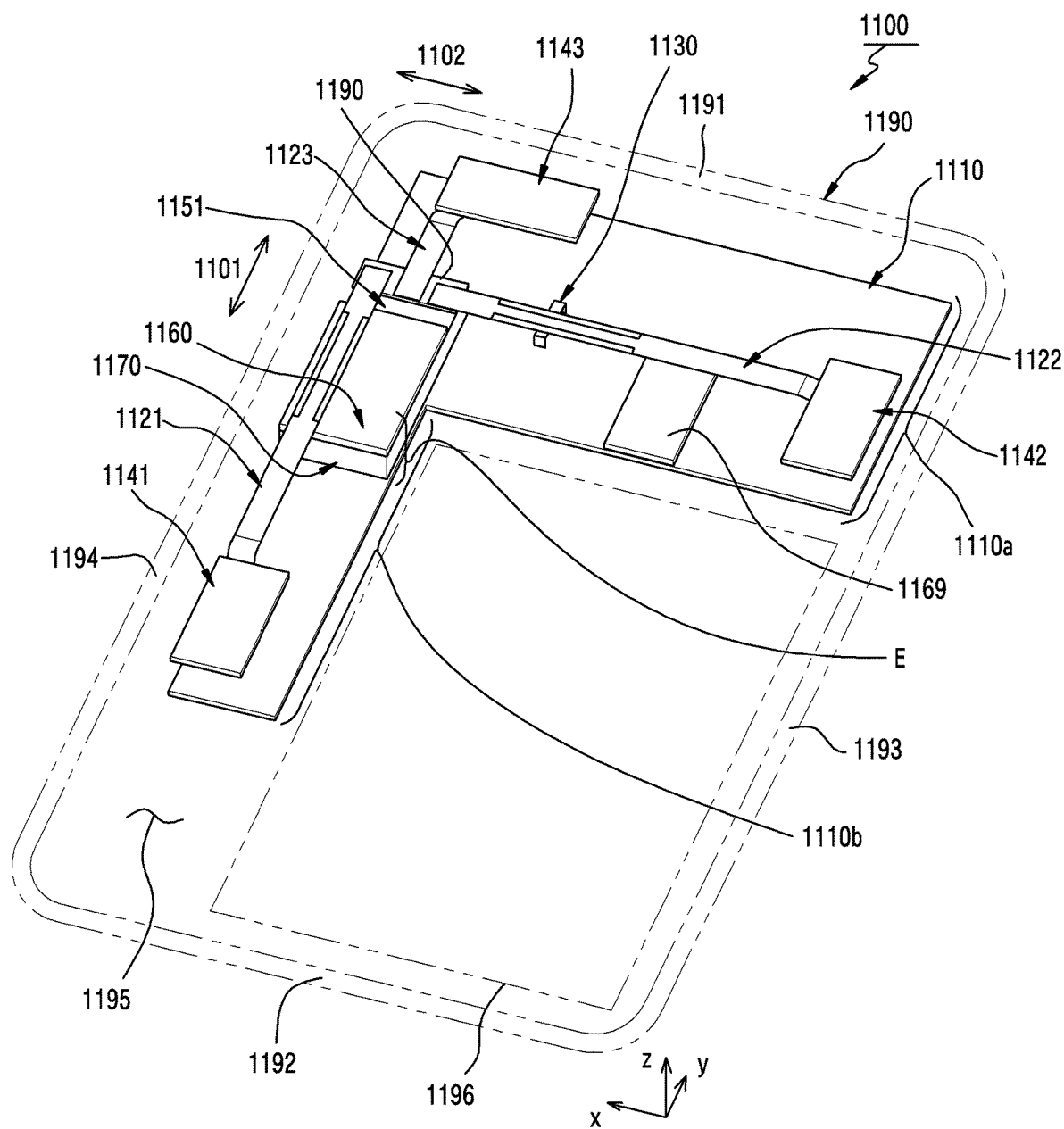
FIG. 11 is a perspective view illustrating an example electronic device including a shield member and a conductive structure for electrically coupling ground layers of an FPCB and a ground layer of a PCB according to an embodiment.
Figure 12:
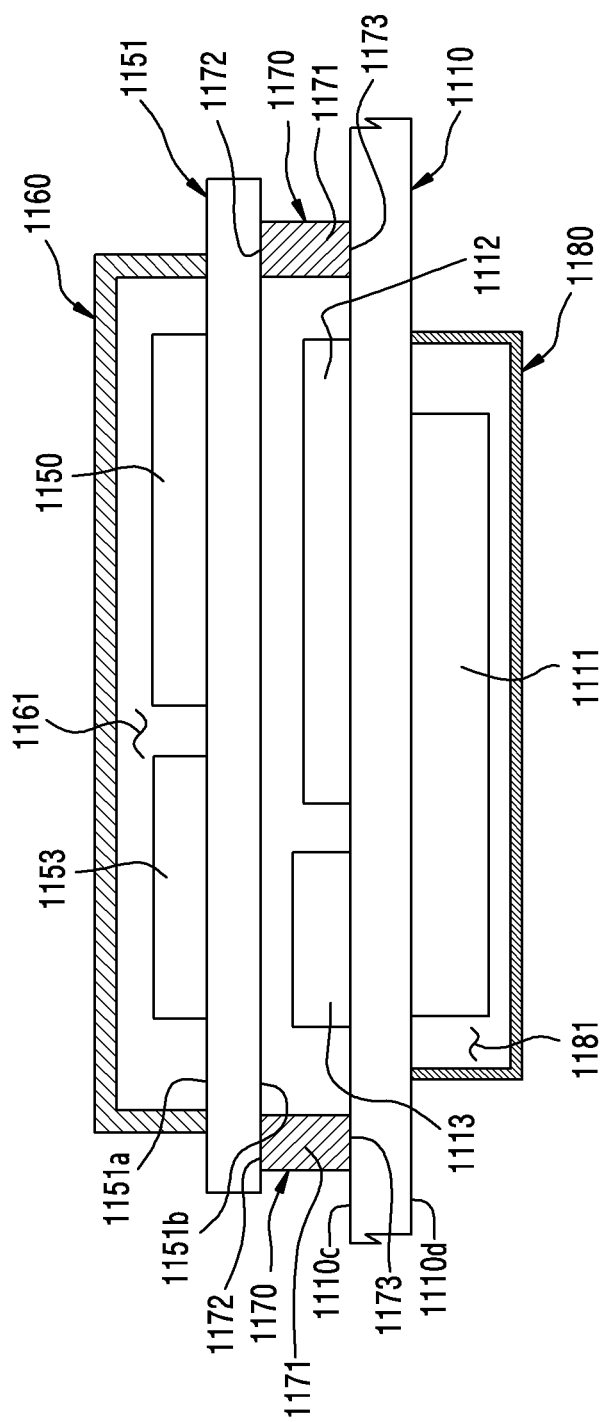
FIG. 12 is a cross-sectional view of section E in FIG. 11.

FIG. 11 is a perspective view illustrating an example electronic device including a shield member and/or a conductive structure for electrically coupling ground layers of an FPCB and a ground layer of a PCB according to an embodiment. FIG. 12 is a cross-sectional view of section E in FIG. 11.

Referring to FIG. 11, according to an embodiment, an electronic device 1100 may include at least one of a first PCB 1110, a plurality of antenna structures 1141, 1142, and 1143, a plurality of FPCBs 1121, 1122, and 1123, a third PCB 1151, one or more connectors 1190, and a conductive structure 1130.

According to an embodiment, the first PCB 1110 may be joined with a first support member 1195 (e.g., the first support member 311 of FIG. 3). The first support member 1195 may be coupled with the side member 1190 (e.g., the side member 310 of FIG. 3) or may be constructed integrally with the side member 1190. The side member 1190 may include a first side member 1191, second side member 1192, third side member 1193, and fourth side member 1194 which surround a space between a first plate (e.g., the first plate 701 of FIG. 7A) and a second plate (e.g., the second plate 702 of FIG. 7A). The first side member 1191 may be parallel with the second side members 1192 and may be spaced apart and arranged side by side in a y-axis direction. The third side member 1193 may be parallel with the fourth side member 1194 and may be spaced apart and arranged side by side in an x-axis direction. According to an embodiment, the first support member 1195 may be a mid-plate or bracket which points to an inner portion surrounded by the side members 1191, 1192, 1193, and 1194 of the side member 1190.

According to an embodiment, the first PCB 1110 (e.g., the first PCB 710 of FIG. 7A) may include a first portion 1110a and a second portion 1110b extendedly protruding from the first portion 1110a. According to an embodiment, the first portion 1110a may be disposed between the first side member 1191 and a battery 1196 (e.g., the battery 350 of FIG. 3), and the second portion 1110b may be disposed between the fourth side member 1194 and the battery 1196.

According to an embodiment, the plurality of antenna structures 1141, 1142, and 1143 may include the first antenna structure 1141 and third antenna structure 1143 disposed to at least partially overlap with the second portion 1110b of the first PCB 1110, and the second antenna structure 1142 disposed to at least partially overlap with the first portion 1110b of the first PCB 1110. For example, when viewed in a z-axis direction, the first antenna structure 1141 may be disposed adjacent (e.g., within about 10 mm) to the fourth side member 1194, the second antenna structure 1142 may be disposed adjacent to the third side member 1193, the third antenna structure 1143 may be disposed adjacent to the first side member 1191.

According to an embodiment, the first antenna structure 1141 (or the second antenna structure 1142) or the third antenna structure 1143 may include one of the antenna modules 421, 422, 423, and 424 of FIG. 4 or the antenna structure 740 of FIG. 7A.

According to an embodiment, the plurality of FPCBs 1121, 1122, and 1123 may include the first FPCB 1121 for electrically coupling the first antenna structure 1141 and the third PCB 1151, the second FPCB 1121 for electrically coupling the second antenna structure 1142 and the third PCB 1151, or the third FPCB 1123 for electrically coupling the third antenna structure 1143 and the third PCB 1151. For example, the first FPCB 1121 or the third FPCB 1123 may be extended in a first direction (e.g., a y-axis direction) 1101 between the first side member 1191 and the second side member 1192, and the second FPCB 1122 may be extended in a second direction (e.g., an x-axis direction) 1102 perpendicular to the first direction 1101. According to an embodiment, the first FPCB 1121 (or the second FPCB 1122 or the third FPCB 1123) may include one of the first FPCB 431, second FPCB 432, third FPCB 433, and fourth FPCB 434 of FIG. 4.

According to an embodiment, the first FPCB 1121, the second FPCB 1122, or the third FPCB 1123 may be electrically coupled with one or more connectors 1190 mounted to the third PCB 1151.

According to an embodiment, the third PCB 1151 may be disposed to at least partially overlap with the first PCB 1110. For example, the third PCB 1151 may overlap with some regions of the second portion 1110b adjacent to the first portion 1110a, may overlap with some regions of the first portion 1110a adjacent to the second portion 1110b.

Referring to FIG. 11 and FIG. 12, according to an embodiment, an interposer 1170 may be disposed between the first PCB 1110 and the third PCB 1151, and may electrically couple the first PCB 1110 and the third PCB 1151.

According to an embodiment, the interposer 1170 may include a non-conductive housing 1171, and the non-conductive housing 1171 may include a front face 1172 facing the third PCB 1151 and a rear face 1173 facing the first PCB 1110. The interposer 1170 may include one or more conductors for providing electrically coupling between the front face 1172 and the rear face 1173. For example, the one or more conductors may include one or more first terminals (not shown) disposed to the front face 1172 of the housing 1171, one or more second terminals (not shown) disposed to the rear face 1173 of the housing 1171, and a conductive path which is disposed on an outer face or inside of the housing 1171 and which electrically couples the one or more first terminals and the one or more second terminals. A conducive material such as a solder may be disposed between the one or more first terminals and corresponding terminals of the third PCB 1151 or between the one or more second terminals and corresponding terminals of the first PCB 1110.

According to various embodiments, the interposer 1170 may include a PCB including one or more inner layers on which a circuit is formed by using Copper Clad Laminates (CCL), first and second outer layers which are disposed at both sides of the inner layers and on which a circuit is formed, or prepregs which bond or isolate one layer from another. For example, the circuit included in the first outer layer may include first terminals electrically coupled with the third PCB 1151, and the circuit included in the second outer layer may include second terminals electrically coupled with the first PCB 1110. A conductive material such as a solder may be disposed between the one or more first terminals and corresponding terminals of the third PCB 1151 or between the one or more second terminals and corresponding terminals of the first PCB 1110.

Referring to FIG. 12, according to an embodiment, the first PCB 1110 may include a first face 1110c facing the third PCB 1151 or a second face 1110d facing away from the first face 1110c. The third PCB 1151 may include a fourth face 1151b facing the first PCB 1110 or a third face 1151a facing away from the fourth face 1151b. According to an embodiment, a processor 1111 (e.g., the processor 120 of FIG. 1 or the processor 440 of FIG. 4) may be disposed on the second face 1110d of the first PCB 1110. According to an embodiment, a first power management circuit (e.g., Power Management Integrated Circuit (PMIC)) 1112 or at least one element (e.g., passive element or active element) 1113 may be disposed on the first face 1110c of the first PCB 1110. According to an embodiment, a first wireless communication circuit 1150 (e.g., the first wireless communication circuit 750 of FIG. 7A or the second communication module 452 of FIG. 4) or a second power management circuit (e.g., PMIC) 1153 may be disposed on a third face 1151a of the third PCB 1151.

Referring to FIG. 11 and FIG. 12, in an embodiment, the first wireless communication circuit 1150 and the antenna structures 1141, 1142, and 1143 may exchange signals (e.g., IF signals and LO signals) for a corresponding network (e.g., a 5G network) through the FPCBs 1121, 1122, and 1123.

According to an embodiment, the first power management circuit 1112 may manage power supplied to elements (e.g., the third PCB 1151). The second power management circuit 1153 may manage power supplied to elements (e.g., the first wireless communication circuit 1150) mounted to the second PCB 1151.

According to an embodiment, a first shield member (e.g., a shield cover or a shield can) 1160 may be joined with the third PCB 1151 to cover elements (e.g., the first wireless communication circuit 1150, the second power management circuit 1153) disposed on the third PCB 1151. According to an embodiment, the first shield member 1160 may be electrically coupled with a ground layer (not shown) of the third PCB 1151. The first wireless communication circuit 1150 may be disposed to an electromagnetic shield space 1161 prepared by the first shield member 1160, and may decrease an influence of electromagnetic noise generated from the inside of the electronic device 1100 or introduced from the outside of the electronic device 1100 on the first wireless communication circuit 1150 or the second power management circuit 1153.

According to various embodiments, a second shield member 1180 may be joined with the first PCB 1110 to cover the processor 1111 disposed on the first PCB 1110. According to an embodiment, the second shield member 1180 may be electrically coupled with the ground layer of the first PCB 1110. The processor 1111 may be disposed to an electromagnetic shield space 1181 prepared by the second shield member 1180, and may decrease an influence of electromagnetic noise generated from the inside of the electronic device 1100 and introduced from the outside of the electronic device 1100 on the processor 1111.

According to various embodiments, a thermal conductive material may be disposed between the second shield member 1180 and the processor 1111, and heat generated from the processor 1111 may be released to the outside through the second shield member 1180.

Referring to FIG. 11 and FIG. 12, in an embodiment, the first shield member 1160 may be disposed between the first FPCB 1121 and the third FPCB 1151, and may be electrically coupled with a ground layer (not shown) of the first FPCB 1121. According to an embodiment, the ground layer of the first FPCB 112 may be electrically coupled with the first shield member 1160 utilizing an embodiment of FIG. 7C. For example, the first FPCB 1121 may include at least one exposure region (e.g., exposure regions 723 and 724 of FIG. 7C), and a conductive material may be disposed between the first shield member 1160 and at least one exposure region.

According to an embodiment, if the ground layer of the first FPCB 1121 is electrically coupled with the ground layer of the third PCB 1151 through the first shield member 1160, when signals (e.g., IF signals and LO signals) are transmitted/received through the first FPCB 1121 between the first wireless communication circuit 1150 and the first antenna structure 1141, electromagnetic noise generated from the inside of the electronic device 1100 or introduced from the outside of the electronic device 1100 can be prevented from and/or reduce affecting transmission/reception of such a signal.

According to an embodiment, the conductive structure 1130 (e.g., the conductive structure 730 of FIG. 7A) may electrically couple a ground layer (e.g., the first ground layers 714 and 715 of FIG. 7A) of the first PCB 1110 and a ground layer (not shown) of the second FPCB 1122. According to an embodiment, the conductive structure 1130 may be disposed between the second FPCB 1121 and the first PCB 1110, and may be electrically coupled with the FPCB 1122. According to some embodiments, the second FPCB 1122 may be disposed between the conductive structure 1130 and the first PCB 1110, and may be electrically coupled with the conductive structure 1130.

According to an embodiment, the conductive structure 1130 and the ground layer the second FPCB 1122 may be electrically coupled utilizing the embodiment of FIG. 7C. For example, the second FPCB 1122 may include at least one exposure region (e.g., exposure regions 723 and 724 of FIG. 7C), and a conductive material may be disposed between the conductive structure 1130 and at least one exposure region.

According to an embodiment, the conductive structure 1130 may be utilized as a support which props the second FPCB 1122, and the second FPCB 1122 may maintain a state of being separated from the first PCB 1110.

According to an embodiment, if the ground layer of the second FPCB 1122 is electrically coupled with the ground layer of the first PCB 1100 through the conductive structure 1130, when signals (e.g., IF signals and LO signals) are transmitted/received through the second FPCB 1122 between the first wireless communication circuit 1150 and the second antenna structure 1142, electromagnetic noise generated from the inside of the electronic device 1100 or introduced from the outside of the electronic device 1100 can be prevented from and/or reduce affecting transmission/reception of such a signal.

According to an embodiment, the electronic device 1100 may further include a third shield member 1169 disposed between the second FPCB 1122 and the first PCB 1110. The third shield member 1169 may be electrically coupled with the ground layer of the first PCB 1110. According to an embodiment, the third shield member 1169 may provide an electromagnetic shield space which covers electronic elements mounted on the first PCB 1110. According to an embodiment, the third shield member 1169 may support the second FPCB 1122, and the second FPCB 1122 may maintain a state of being spaced apart from the first PCB 1110. According to various embodiments, in order to decrease an electromagnetic influence between elements, the ground layer of the second FPCB 1122 may be electrically coupled with the third shield member 1169.

According to an embodiment, the third FPCB 1123 may have a relatively shorter length than the first FPCB 1121 or the second FPCB 1122. Due to such an electrical length, an influence of electromagnetic noise generated from the inside of the electronic device 1100 or introduced from the outside of the electronic device 1100 on the third FPCB 1123 may be below a specific level. In the embodiment of FIG. 11, a conductive structure (e.g., the conductive structure 730 of FIG. 7A) which electrically couples the ground layer of the third FPCB 1123 and the ground layer of the first FPCB 1110 is not included. However, according to an embodiment, the conductive structure may be added to electrically couple the ground layer of the third FPCB 1123 and the ground layer of the first FPCB 1110.

According to an embodiment of the disclosure, an electronic device (e.g., the electronic device 700 of FIG. 7A) may include a housing including a first plate (e.g., the first plate 701 of FIG. 7A), a second plate (e.g., the second plate 702 of FIG. 7A) facing away from the first plate, and a side member (e.g., the side member 703 of FIG. 7A) surrounding a space between the first plate and the second plate and joined to the second plate or constructed integrally with the second plate. The electronic device 700 may include a display (e.g., the display 704 of FIG. 7A) visible through at least part of the first plate, a first Printed Circuit Board (PCB) (e.g., the first PCB 710 of FIG. 7A) disposed between the first plate and the second plate and including at least one first ground layer (e.g., the first ground layers 714 and 715 of FIG. 7A), and a Flexible Printed Circuit Board (FPCB) (e.g., the FPCB 720 of FIG. 7A) at least partially overlapping with the first PCB when viewed from above the first plate. The FPCB may include a first end (e.g., the first end 721 of FIG. 7A) electrically coupled to the first PCB, a second end (e.g., the second end 722 of FIG. 7A), and at least one second ground layer (not shown). The electronic device may include a conductive structure (e.g., the conductive structure 730 of FIG. 7A) disposed between the first PCB and the FPCB and electrically coupling the first ground layer and the second ground layer.

According to an embodiment of the disclosure, the electronic device (e.g., the electronic device 700 of FIG. 7A) may further include an antenna structure (e.g., the antenna structure 740 of FIG. 7A) electrically coupled to the second end (e.g., the second end 722 of FIG. 7A) and disposed between the first plate (e.g., the first plate 701 of FIG. 7A) and the second plate (e.g., the second plate 702 of FIG. 7B). The antenna structure may include a second PCB (e.g., the second PCB 742 of FIG. 7A) including a first face (e.g., the first face 7401 of FIG. 7A) and a second face (not shown) facing away from the first face, and at least one conductive pattern (e.g., the conductive patterns 743 and 744 of FIG. 7A) disposed on the first face and/or the second face in the second PCB.

According to an embodiment of the disclosure, the at least one conductive pattern (e.g., the conductive patterns 743 and 744) may include an antenna array.

According to an embodiment of the disclosure, the second PCB (e.g., the second PCB 742 of FIG. 7A) may be disposed in the space such that the first face (e.g., the first face 7401 of FIG. 7A) or the second face faces the second plate (e.g., the second plate 702 of FIG. 7A) or the side member (e.g., the side member 703 of FIG. 7A).

According to an embodiment of the disclosure, the first end (e.g., the first end 721 of FIG. 7A) may be coupled to a first connector (e.g., the first connector 711 of FIG. 7A) disposed to the first PCB (e.g., the first PCB 710 of FIG. 7A), and the second end (e.g., the second end 722 of FIG. 7A) may be coupled to a second connector (e.g., the second connector 741 of FIG. 7A) disposed to the second PCB (e.g., the second PCB 742 of FIG. 7A).

According to an embodiment of the disclosure, the electronic device (e.g., the electronic device 700 of FIG. 7A) may include a first wireless communication circuit (e.g., the first wireless communication circuit 750 of FIG. 7A) disposed to the first PCB (e.g., the first PCB 710 of FIG. 7A) and electrically coupled to the first end (e.g., the first end 721 of FIG. 7A), and a second wireless communication circuit (e.g., the second wireless communication circuit 745) disposed to the second PCB (e.g., the second PCB 742 of FIG. 7A) and electrically coupled to the second end (e.g., the second end 722 of FIG. 7A).

According to an embodiment of the disclosure, the first wireless communication circuit (e.g., the first wireless communication circuit 750 of FIG. 7A) may include an Intermediate Frequency Integrated Circuit (IFIC), and the second wireless communication circuit (e.g., the second wireless communication circuit 745 of FIG. 7A) may include a Radio Frequency Integrated Circuit (RFIC).

According to an embodiment of the disclosure, the first wireless communication circuit (e.g., the first wireless communication circuit 750 of FIG. 7A) may transmit and/or receive a first signal having a frequency between about 5 GHz and about 15 GHz, and the second wireless communication circuit (e.g., the second wireless communication circuit 745 of FIG. 7A) may transmit and/or receive a second signal having a frequency between about 24 GHz and about 100 GHz.

According to an embodiment of the disclosure, the at least one conductive pattern (e.g., the conductive patterns 743 and 744 of FIG. 7A) may include a first antenna element and a second antenna element disposed to be spaced apart from the first antenna element. The second wireless communication circuit (e.g., the second wireless communication circuit 745 of FIG. 7A) may include a first electrical path electrically coupled to a first point on the first antenna element, and a second electrical path electrically coupled to a second point on the second antenna element. The second wireless communication circuit may provide a phase difference between the first signal at the first point and the second signal at the second point.

According to an embodiment of the disclosure, the electronic device (e.g., the electronic device 1100 of FIG. 11) may further include a third PCB (e.g., the third PCB 1151 of FIG. 11 or 12) disposed at least overlapping with the first PCB (e.g., the first PCB 1110 of FIG. 11 or 12) and electrically coupled with the first PCB 1110. The third PCB 1151 may include a wireless communication circuit (e.g., the first wireless communication circuit 1150 of FIG. 12) electrically coupled to the antenna structure (e.g., the antenna structure 1142 of FIG. 11) through the FPCB (e.g., the FPCB 1122 of FIG. 11).

According to an embodiment of the disclosure, the electronic device (e.g., the electronic device 1100 of FIG. 11) may include an interposer (e.g., the interposer 1170 of FIG. 11 or 12) disposed between the first PCB (e.g., the first PCB 1110 of FIG. 11 or 12) and the third PCB (e.g., the third PCB 1151 of FIG. 11 or 12).

According to an embodiment of the disclosure, the conductive structure (e.g., the conductive structure 730 of FIG. 7A or 7B) may include a first conductive portion (e.g., the first conductive portion 731 of FIG. 7B) electrically coupled at a first position of the first ground layer (e.g., the first ground layers 714 and 715 of FIG. 7A), a second conductive portion (e.g., the second conductive portion 732 of FIG. 7B) electrically coupled at a second position, different from the first position, of the first ground layer, and a third conductive portion (e.g., the third conductive portion 733 of FIG. 7B) electrically coupled between the first portion and the second portion and electrically coupled with the second ground layer.

According to an embodiment of the disclosure, the third conductive portion (e.g., the third conductive portion 733 of FIG. 7A or 7B) may be spaced apart from the first PCB (e.g., the first PCB 710 of FIG. 7A or 7B).

According to an embodiment of the disclosure, the conductive structure (e.g., the conductive structure 730 of FIG. 7A or 7B) may include a metal plate in which the first conductive portion (e.g., the first conductive portion 731 of FIG. 7B), the second conductive portion (e.g., the second conductive portion 732 of FIG. 7B), and the third conductive portion (e.g., the third conductive portion 733 of FIG. 7B) are constructed integrally.

According to an embodiment of the disclosure, the FPCB (e.g., the FPCB 720 of FIG. 7C) may include at least one region (e.g., the exposure regions 723 and 724 of FIG. 7C) in which the second ground layer is partially exposed, and a conductive material may be disposed between the at least one region and the third conductive portion (e.g., the third conductive portion 733 of FIG. 7C).

According to an embodiment of the disclosure, an end (e.g., the end 7312 of FIG. 7B) of the first conductive portion (e.g., the first conductive portion 731 of FIG. 7B) or an end (e.g., the end 7322 of FIG. 7B) of the second conductive portion (e.g., the second conductive portion 732 of FIG. 7B) may be joined with the first PCB (e.g., the first PCB 710 of FIG. 7B) by using a conductive material.

According to an embodiment of the disclosure, the electronic device may further include a first metal member recess (e.g., the third connector 860 of FIG. 8B) disposed at the first position of the first ground layer (e.g., the first ground layers 814 and 815 of FIG. 8A) and including a recess (e.g., the recess 864 of FIG. 8B) through which the first conductive portion is partially inserted, and a second metal member (e.g., the fourth connector 870 of FIG. 8B) disposed at the second position of the first ground layer and including a recess (e.g., the recess 874 of FIG. 8B) through which the second conductive portion (e.g., the second conductive portion 832 of FIG. 8B) is partially inserted.

According to an embodiment of the disclosure, the FPCB (e.g., the FPCB 820 of FIG. 8B) may be disposed between the third conductive portion (e.g., the third conductive portion 833 of FIG. 8B) and the first PCB (e.g., the first PCB 810 of FIG. 8B).

According to an embodiment of the disclosure, the third conductive portion (e.g., the third plate 1035 of FIG. 10A) may be disposed between the FPCB (e.g., the FPCB 1020 of FIG. 10A) and the first PCB (e.g. the first PCB 1010 of FIG. 10A).

According to an embodiment of the disclosure, the conductive structure (e.g., the metal cover 1030 and metal sheet 1060 of FIG. 10A) may include a metal cover (e.g., the metal cover 1030 of FIG. 10A) disposed between the first PCB (e.g., the first PCB 1010 of FIG. 10A) and the FPCB (e.g., the FPCB 1020 of FIG. 10A) and electrically coupled to the first ground layer (e.g., the first ground layers 1014 and 1015 of FIG. 10A), and a metal sheet (e.g., the metal sheet 1060 of FIG. 10A) electrically coupled to the metal cover. The FPCB may be disposed between the metal cover and the metal sheet, and the second ground layer may be electrically coupled to the metal sheet.

While various example embodiments are disclosed and illustrated in the present disclosure, one skilled in the art will understand that the various example embodiments are intended to be illustrative, not limiting. Therefore, it should be understood that, in addition to the embodiments disclosed herein, all modifications or changed forms derived from the technical idea of the present disclosure fall within the scope of the present disclosure.

What is claimed is:

1. An electronic device comprising:
 a housing including a first plate, a second plate facing away from the first plate, and a side housing surrounding a space between the first plate and the second plate and joined to the second plate or being integral with the second plate;
 a display viewable through at least part of the first plate;
 a first Printed Circuit Board (PCB) disposed between the first plate and the second plate and including at least one first ground layer;
 a Flexible Printed Circuit Board (FPCB) including a first end electrically coupled to the first PCB, a second end, and at least one second ground layer; and
 a conductive structure electrically coupling the first ground layer and the second ground layer, wherein the conductive structure includes:
  a first conductive portion electrically coupled at a first position of the first ground layer;
  a second conductive portion electrically coupled to the first ground layer at a second position, different from the first position; and
  a third conductive portion electrically coupled between the first conductive portion and the second conductive portion, and electrically coupled with the second ground layer, and
 wherein the FPCB is disposed between the third conductive portion and the first PCB.

2. An electronic device comprising:
 a housing including a first plate, a second plate facing away from the first plate, and a side housing surrounding a space between the first plate and the second plate and joined to the second plate or being integral with the second plate;
 a display viewable through at least part of the first plate;
 a first Printed Circuit Board (PCB) disposed between the first plate and the second plate and including at least one first ground layer;
 a Flexible Printed Circuit Board (FPCB) at least partially overlapping the first PCB, wherein the FPCB includes a first end electrically coupled to the first PCB, a second end, and at least one second ground layer;
 a conductive structure electrically coupling the first ground layer and the second ground layer, wherein the conductive structure includes:
  a first conductive portion electrically coupled at a first position of the first ground layer;
  a second conductive portion electrically coupled to the first ground layer at a second position, different from the first position; and
  a third conductive portion electrically coupled between the first conductive portion and the second conductive portion, and electrically coupled with the second ground layer; and
 an antenna structure comprising at least one antenna electrically coupled to the second end and disposed between the first plate and the second plate, the antenna structure including:
  a second PCB including a first face and a second face facing away from the first face; and
  at least one conductive pattern disposed on the first face and/or the second face in the second PCB.

3. The electronic device of claim 2, wherein the at least one conductive pattern includes an antenna array.

4. The electronic device of claim 2, wherein the second PCB is disposed in the space such that the first face or the second face faces the second plate or the side housing.

5. The electronic device of claim 2,
 wherein the first end is coupled to a first connector disposed to the first PCB, and
 wherein the second end is coupled to a second connector disposed to the second PCB.

6. The electronic device of claim 2, further comprising:
 a first wireless communication circuit disposed to the first PCB and electrically coupled to the first end; and
 a second wireless communication circuit disposed to the second PCB and electrically coupled to the second end.

7. The electronic device of claim 6,
 wherein the first wireless communication circuit includes an Intermediate Frequency Integrated Circuit (IFIC), and
 wherein the second wireless communication circuit includes a Radio Frequency Integrated Circuit (RFIC).

8. The electronic device of claim 6,
 wherein the first wireless communication circuit is configured to transmit and/or receive a first signal having a frequency between about 5 GHz and about 15 GHz, and
 wherein the second wireless communication circuit is configured to transmit and/or receive a second signal having a frequency between about 24 GHz and about 100 GHz.

9. The electronic device of claim 6,
 wherein the at least one conductive pattern includes a first antenna element comprising a first antenna and a second antenna element comprising a second antenna disposed to be spaced apart from the first antenna element,
 wherein the second wireless communication circuit includes a first electrical path electrically coupled to a first point on the first antenna element, and a second electrical path electrically coupled to a second point on the second antenna element, and the second wireless communication circuit is configured to provide a phase difference between a first signal at the first point and a second signal at the second point.

10. The electronic device of claim 2, further comprising a third PCB disposed to overlap at least the first PCB and being electrically coupled with the first PCB,
wherein the third PCB includes a wireless communication circuit electrically coupled to the antenna structure through the FPCB.

11. The electronic device of claim 10, further comprising an interposer disposed between the first PCB and the third PCB.

12. The electronic device of claim 1, wherein the third conductive portion is spaced apart from the first PCB.

13. The electronic device of claim 1, wherein the conductive structure includes a metal plate wherein the first conductive portion, the second conductive portion, and the third conductive portion integral with each other.

14. An electronic device comprising:
a housing including a first plate, a second plate facing away from the first plate, and a side housing surrounding a space between the first plate and the second plate and joined to the second plate or being integral with the second plate;
a display viewable through at least part of the first plate;
a first Printed Circuit Board (PCB) disposed between the first plate and the second plate and including at least one first ground layer;
a Flexible Printed Circuit Board (FPCB) at least partially overlapping the first PCB, wherein the FPCB includes a first end electrically coupled to the first PCB, a second end, and at least one second ground layer; and
a conductive structure electrically coupling the first ground layer and the second ground layer, wherein the conductive structure includes:
a first conductive portion electrically coupled at a first position of the first ground layer;
a second conductive portion electrically coupled to the first ground layer at a second position, different from the first position; and
a third conductive portion electrically coupled between the first conductive portion and the second conductive portion, and electrically coupled with the second ground layer,
wherein the FPCB includes at least one region in which the second ground layer is partially exposed, and
wherein a conductive material is disposed between the at least one region and the third conductive portion.

15. The electronic device of claim 1, wherein an end of the first conductive portion or an end of the second conductive portion is joined with the first PCB using a conductive material.

16. The electronic device of claim 1, further comprising:
a first recess comprising a metal disposed at the first position of the first ground layer and including a recess through which the first conductive portion is partially inserted; and
a second recess comprising a metal disposed at the second position of the first ground layer and including a recess through which the second conductive portion is partially inserted.

17. The electronic device of claim 14, wherein the FPCB is disposed between the third conductive portion and the first PCB.

18. The electronic device of claim 14, wherein the third conductive portion is disposed between the FPCB and the first PCB.

19. An electronic device comprising:
a housing including a first plate, a second plate facing away from the first plate, and a side housing surrounding a space between the first plate and the second plate and joined to the second plate or being integral with the second plate;
a display viewable through at least part of the first plate;
a first Printed Circuit Board (PCB) disposed between the first plate and the second plate and including at least one first ground layer;
a Flexible Printed Circuit Board (FPCB) at least partially overlapping the first PCB when viewed from above the first plate, wherein the FPCB includes a first end electrically coupled to the first PCB, a second end, and at least one second ground layer; and
a conductive structure comprising a conductive material disposed between the first PCB and the FPCB and electrically coupling the first ground layer and the second ground layer, wherein the conductive structure includes a metal cover disposed between the first PCB and the FPCB and electrically coupled to the first ground layer, and a metal sheet electrically coupled to the metal cover, and
wherein the FPCB is disposed between the metal cover and the metal sheet, and the second ground layer is electrically coupled to the metal sheet.

* * * * *